US010993359B2

(12) United States Patent
Taniguchi

(10) Patent No.: US 10,993,359 B2
(45) Date of Patent: Apr. 27, 2021

(54) COMPONENT MOUNTER, REEL HOLDING DEVICE

(71) Applicant: YAMAHA HATSUDOKI KABUSHIKI KAISHA, Shizuoka (JP)

(72) Inventor: Yuzuru Taniguchi, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 317 days.

(21) Appl. No.: 15/766,293

(22) PCT Filed: Oct. 9, 2015

(86) PCT No.: PCT/JP2015/078798
§ 371 (c)(1),
(2) Date: Apr. 5, 2018

(87) PCT Pub. No.: WO2017/061042
PCT Pub. Date: Apr. 13, 2017

(65) Prior Publication Data
US 2018/0310445 A1     Oct. 25, 2018

(51) Int. Cl.
*H05K 13/04*     (2006.01)
(52) U.S. Cl.
CPC .............................. *H05K 13/0419* (2018.08)
(58) Field of Classification Search
CPC ... H05K 13/0419; H05K 13/02; H05K 13/021
See application file for complete search history.

(56) References Cited

U.S. PATENT DOCUMENTS 5,598,986 A * 2/1997 Ando ................ H05K 13/0419
242/597.6
6,059,216 A   5/2000 Ogura
(Continued)

FOREIGN PATENT DOCUMENTS

JP    H11-186787 A    7/1999
JP    2004-228207 A   8/2004
(Continued)

OTHER PUBLICATIONS

An Office Action mailed by the State Intellectual Property Office of the People's Republic of China dated Sep. 3, 2019, which corresponds to Chinese Patent Application No. 201580083540.3 and is related to U.S. Appl. No. 15/766,293.
(Continued)

*Primary Examiner* — Minh N Trinh
(74) *Attorney, Agent, or Firm* — Studebaker & Brackett PC

(57) ABSTRACT

A reel holder includes a reel supporting member that is configured to support an axle against a force of gravity. The reel supporting member has an abutting part configured to support a reel, form a discharge opening having a width that allows the axle of the reel to be discharged through the discharge opening, and abut on carrier tape that is wound around the axle and accommodates a component. The reel holder further includes a tape supplier configured to pull out the carrier tape from the reel held by the reel holder and feed the carrier tape to a predetermined component supplying position. The axle of the reel, which displaces under the force of gravity with a decreasing amount of the carrier tape wound around the axle by pulling the carrier tape from the reel, is guided to the discharge opening by the reel supporting member.

15 Claims, 19 Drawing Sheets

(56) References Cited

U.S. PATENT DOCUMENTS

| 9,137,936 B2* | 9/2015 | Katsumi | H05K 13/0417 |
| 2015/0115093 A1* | 4/2015 | Tanokuchi | H05K 13/021 |
| | | | 242/560.1 |
| 2018/0303014 A1* | 10/2018 | Taniguchi | H05K 13/021 |
| 2018/0310445 A1* | 10/2018 | Taniguchi | H05K 13/0419 |

FOREIGN PATENT DOCUMENTS

| JP | 2010-147223 A | 7/2010 |
| JP | 2011-006159 A | 1/2011 |
| JP | 2014-011315 A | 1/2014 |

OTHER PUBLICATIONS

International Search Report issued in PCT/JP2015/078798; dated Dec. 15, 2015.

* cited by examiner

COMPONENT MOUNTER, REEL HOLDING DEVICE

CROSS-REFERENCE TO RELATED APPLICATION

This application is a National Stage of International Patent Application No. PCT/JP2015/078798, filed Oct. 9, 2015, the entire content of which is incorporated herein by reference.

BACKGROUND

Technical Field

This disclosure relates to a technique for holding a reel having a carrier tape accommodating components wound around the axle.

Background Art

In a component mounter conventionally used, a component is supplied to a predetermined component supplying position by feeding carrier tape accommodating the components using a tape feeder, and the component is taken out from the component supplying position and mounted on a board using a mounting head. In such a component mounter, a reel having an axle on which the carrier tape is wound is arranged to correspond to the tape feeder, and the tape feeder feeds the carrier tape pulled out from the reel to the component supplying position. Particularly a component mounter described in JP2004-228207 includes a pair of holding axes for holding a reel by abutting on the outer periphery of the reel from below.

SUMMARY

When the carrier tape wound around the axle of the reel is used up, an operator can remove the reel from the pair of holding axes easily by lifting up the reel. To increase the efficiency of operation by the operator, however, a technique allowing further reduction in operator's burden required to remove the reel has been desired.

This disclosure was developed in view of the above problem and aims to provide a technique allowing reduction in operator's burden required to remove a reel after carrier tape wound around an axle is used up.

A component mounter according to the disclosure comprises a reel holding device including a reel supporting member that is configured to support an axle against a force of gravity and has an abutting part configured to support a reel, form a discharge opening having a width that allows the axle of the reel to be discharged through the discharge opening and abut on carrier tape that is wound about the reel and accommodates a component. The component mounter further comprises a tape supplying part configured to pull out the carrier tape from the reel held by the reel holding device and feed the carrier tape to a predetermined component supplying position. The axle, which displaces under the force of gravity with decreasing amount of the carrier tape wound around the axle by pulling the carrier tape from the reel, is guided to the discharge opening by the reel supporting member.

A holding device according to the disclosure comprises a body configured to house a reel having an axle around which a carrier tape housing a component wound. The holding device further includes a reel supporting member that is attached to the body and configured to form a discharge opening having a width allowing the axle to be discharged through the discharge opening and support the axle against the force of gravity by abutting on the carrier tape. The axle, which displaces under the force of gravity with decreasing amount of the carrier tape wound around the axle by pulling the carrier tape from the reel, is guided to the discharge opening by the reel supporting member.

According to the present disclosure (component mounter and reel holding device) having the above-described configuration, the axle of the reel is supported against the force of gravity by the reel supporting member abutting on the carrier tape wound around the axle of the reel. In this support supporting configuration, as the carrier tape is pulled out from the reel to reduce the amount of the carrier tape wound around the axle, the axle is displaced under the force of gravity. In particular, according to the present disclosure, the reel supporting member guides this displacement of the axle to the discharge opening. In this way, the axle is guided to the discharge opening automatically in response to reduction in the amount of the carrier tape, so that the reel can be discharged from the reel holding device thereafter only by discharging the axle through the discharge opening. The reel may be discharged without requiring operation with a hand of an operator as described above, or with a hand of the operator. Specifically, the operator is allowed to discharge the reel from the reel holding device by easy operation such as ejecting the axle through the discharge opening, for example. In this way, operator's burden in removing the reel can be reduced after the carrier tape wound around the axle is used up.

The present disclosure allows reduction in operator's burden in removing the reel after the carrier tape wound around the axle of the reel is used up.

DETAILED DESCRIPTION

Figure 1:
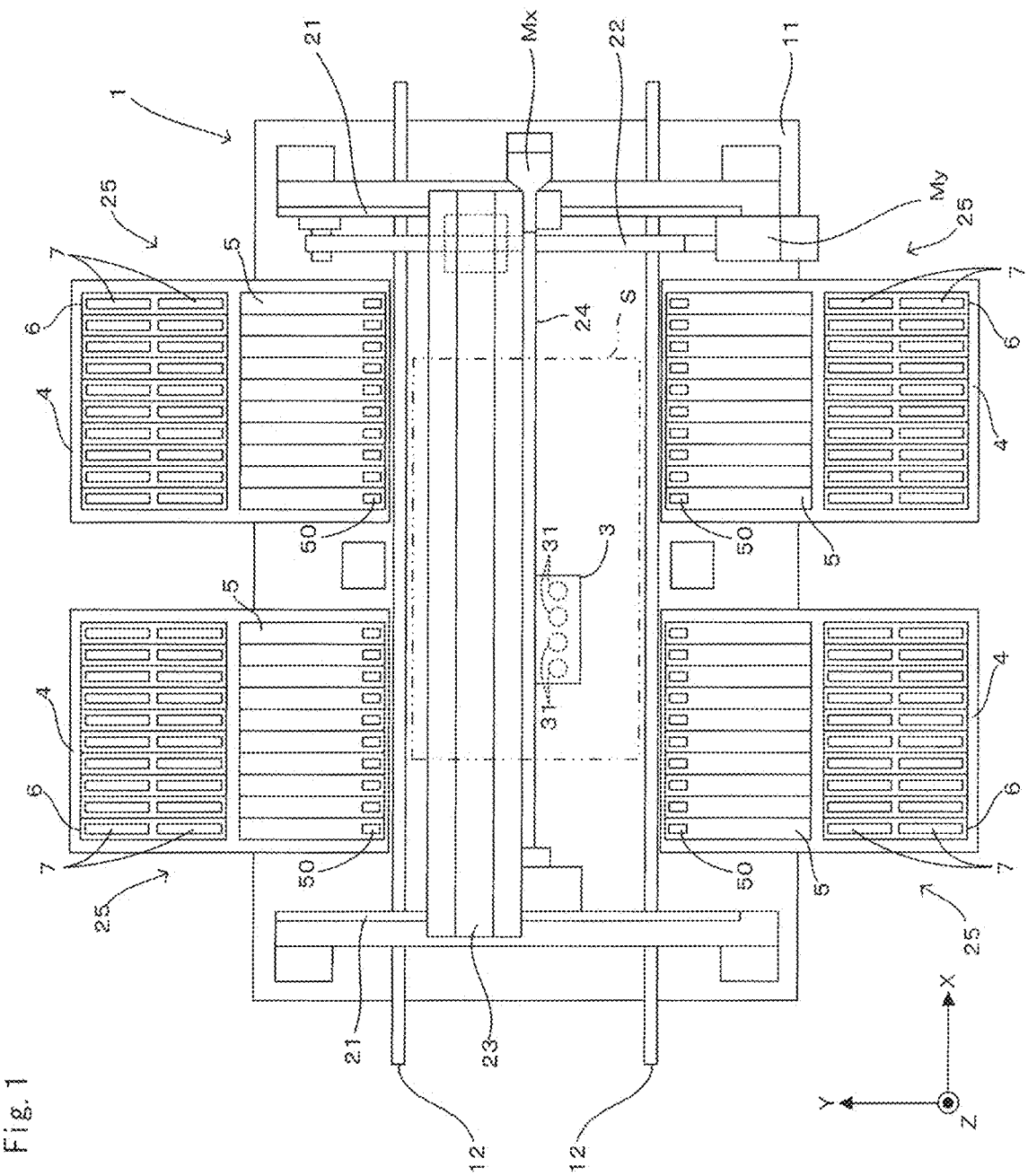
FIG. 1 is a partial plan view schematically showing a component mounter according to the disclosure.

FIG. 1 is a partial plan view schematically showing a component mounter according to the disclosure. In FIG. 1, an XYZ orthogonal coordinate system with a Z direction parallel to a vertical direction and X and Y direction respectively parallel to a horizontal direction is shown. This component mounter 1 includes a pair of conveyors 12, 12 provided on a base 11. The component mounter 1 mounts a component on a board S carried to a work position (position of the board S of FIG. 1) from an upstream side in the X direction (board conveying direction) by the conveyors 12 and carries out the board S completed with component mounting from the work position to a downstream side in the X direction by the conveyors 12.

The component mounter 1 is provided with a pair of Y-axis rails 21, 21 extending in the Y direction, a Y-axis ball screw 22 extending in the Y direction and a Y-axis motor My configured to rotationally drive the Y-axis ball screw 22, and a head supporting member 23 is fixed to a nut of the Y-axis ball screw 22 while being supported on the pair of Y-axis rails 21, 21 movably in the Y direction. An X-axis ball screw 24 extending in the X direction and an X-axis motor Mx configured to rotationally drive the X-axis ball screw 24 are attached to the head supporting member 23, and a head unit 3 is fixed to a nut of the X-axis ball screw 24 while being supported on the head supporting member 23 movably in the X direction. Thus, the head unit 3 can be moved in the Y direction by rotating the Y-axis ball screw 22 by the Y-axis motor My or can be moved in the X direction by rotating the X-axis ball screw 24 by the X-axis motor Mx.

Two component supplying units 25 are arranged in the X direction on each of both sides of the pair of conveyors 12, 12 in the Y direction, and a feeder mounting carriage 4 is removably attached to each component supplying unit 25. A plurality of tape feeders 5 arranged in the X direction and a plurality of reel holders 6 arranged in the X direction are removably attached to this feeder mounting carriage 4, one tape feeder 5 and one reel holder 6 are arranged in the Y direction while being associated with each other.

A carrier tape TP accommodating small-piece components (chip electronic components) such as integrated circuits, transistors and capacitors at predetermined intervals is wound on a reel 7 held by each reel holder 6. This carrier tape TP is a conventionally known embossed tape and configured such that components accommodated in each of a plurality of pockets aligned in a row at equal intervals are covered with a cover. Further, a plurality of engagement holes aligned at fixed intervals along an edge penetrate through one side of the carrier tape TP. As described later, two carrier tapes TP can be attached to each tape feeder 5. Corresponding to this, each reel holder 6 holds two reels 7 arranged in the Y direction. Each tape feeder 5 supplies the components in the carrier tape TP to a predetermined component supplying position 50 by intermittently feeding the carrier tape TP withdrawn from the reel 7 in the reel holders 6 adjacent in the Y direction toward the head unit 3.

The head unit 3 includes a plurality of (four) mounting heads 31 arranged in the X direction. Each mounting head 4 has an elongated shape extending in the Z direction (vertical direction) and can suck and hold the component by a nozzle disengageably attached to the lower end thereof. That is, the mounting head 31 moves to a position above the tape feeder 4 and suck the component supplied by the tape feeder 4. Subsequently, the mounting head 31 moves to a position above the board S at the work position and mounts the component on the board S by releasing the suction of the component. In this way, the mounting head 31 performs component mounting of taking out the component supplied to the component supplying position 50 by the tape feeder 5 from the carrier tape TP and mounting the component on the board S.

Figure 2:
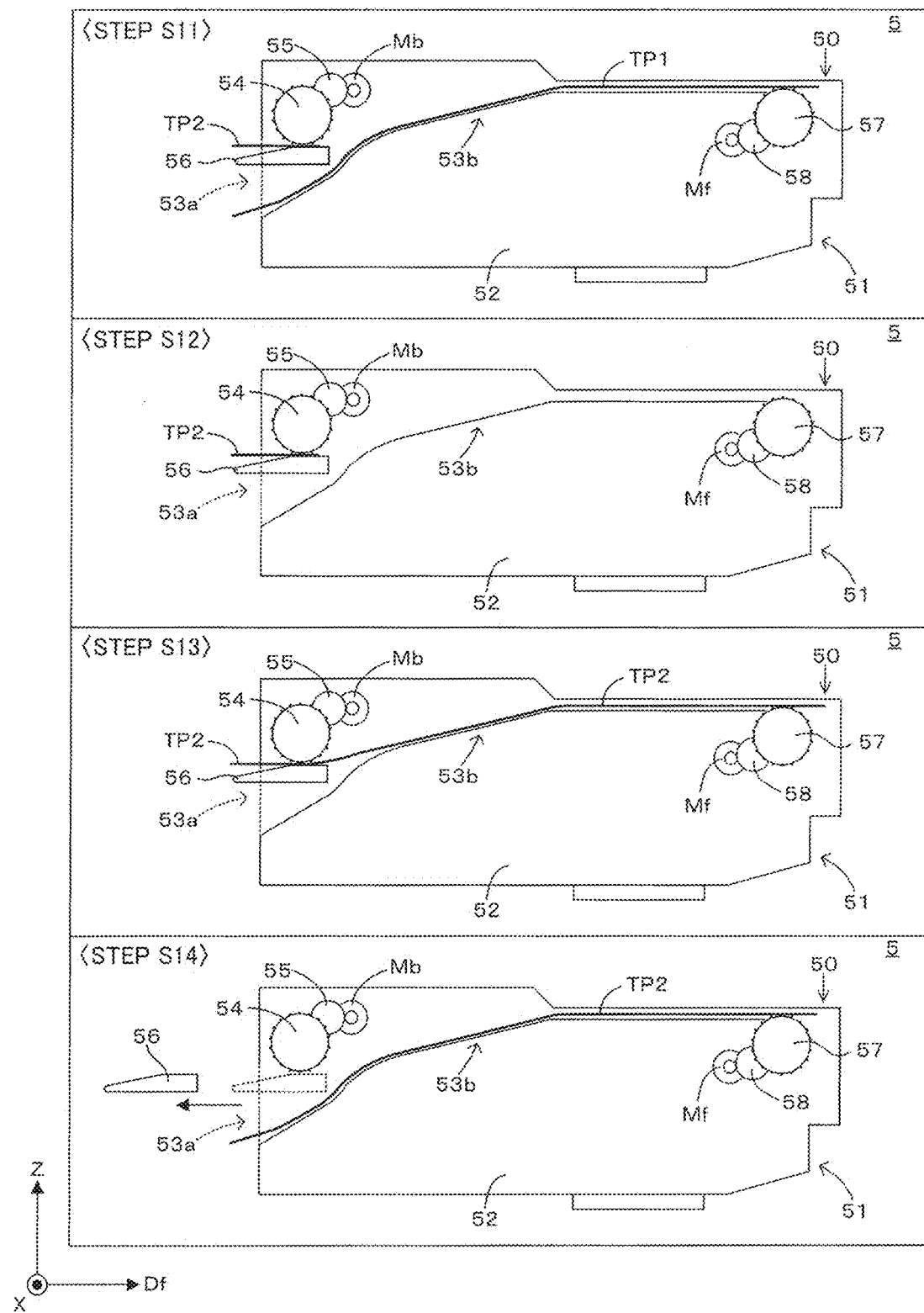
FIG. 2 is side views schematically showing an example of the configuration and operation of the tape feeder.

FIG. 2 is side views schematically showing an example of the configuration and operation of the tape feeder. In FIG. 2 and subsequent figures, a feed direction Df (parallel to the Y direction) in which the tape feeder 5 feeds the carrier tape TP is shown as appropriate, an arrow side of the feed direction Df is referred to as a "front side" of the feed direction Df and a side opposite to the arrow of the feed direction Df is referred to as a "back side" of the feed direction Df. Further, to distinguish the two carrier tapes TP mountable in the tape feeder 5, different reference signs TP1, TP2 are appropriately used for the carrier tapes in FIG. 2 and subsequent figure.

The tape feeder 5 includes a feeder main body 51, which is a mechanical configuration, and motors Mf, Mb configured to drive the feeder main body 51. The feeder main body 51 includes a flat case 52 thin in the X direction and long in the feed direction Df. An insertion opening 53a (shown by dotted line) extending in the Z direction is open in the back end of the case 52 in the feed direction Df, and the aforementioned component supplying position 50 is provided on the upper surface of a front part of the case 51 in the feed direction Df. A tape conveying path 53b from the insertion opening 53a to the component supplying position 50 is provided in the feeder main body 51. This feeder main body 51 supplies the component to the component supplying position 50 by feeding the carrier tape TP inserted into the tape conveying path 53b through the insertion opening 53a in the feed direction Df by receiving drive forces of the motors Mf, Mb.

Specifically, the feeder main body 51 includes, in the case 52, a sprocket 54 arranged adjacent to the insertion opening 53a above the tape conveying path 53b and a gear 55 configured to transmit the drive force of the motor Mb to the sprocket 54, and the sprocket 54 rotates by receiving the drive force generated by the motor Mb. Further, the feeder main body 51 includes a tape supporting member 56 removably attached to the case 52. This tape supporting member 56 faces the sprocket 54 from below and causes the carrier tape TP to engage the sprocket 54 by sandwiching the carrier tape TP between the tape supporting member 56 and the sprocket 54. In this way, the sprocket 54 can feed the carrier tape TP in the feed direction Df by rotating while being engaged with the carrier tape TP. Further, the feeder main body 51 includes, in the case 52, a sprocket 57 arranged in a front end part thereof and adjacent to the tape conveying path 53b from below and a gear 58 configured to transmit the drive force of the motor Mf to the sprocket 57, and the sprocket 57 rotates by receiving the drive force generated by the motor Mf. Thus, the sprocket 57 can intermittently convey the carrier tape TP in the feed direction Df by intermittently rotating while being engaged with the carrier tape TP.

Step S11 corresponds to a state while the mounting head 31 is performing component mounting. That is, the carrier tape TP1 is inserted into the feeder main body 51 along the tape conveying path 53b, and the sprocket 57 supplies the component to the component supplying position 50 by intermittently conveying the carrier tape TP1 in the feed direction Df. Then, the mounting head 31 mounts the component supplied to the component supplying position 50 on the board S. Further, in Step S11, the tip of the carrier tape TP2 used for component mounting next to the carrier tape TP1 is mounted between the sprocket 54 and the tape supporting member 56. In this way, the carrier tape TP2 to be used next waits in a rear end part of the feeder main body 51.

As shown in Step S12, when the components in the carrier tape TP1 are used up and the tape feeder 5 discharges the carrier tape TP1, loading shown in Step 13 is performed. Specifically, the sprocket 54 starts rotating to feed the carrier tape TP2 toward the component supplying position 50 in the feed direction Df and the tip of the carrier tape TP2 is engaged with the sprocket 57. Subsequently, when the operator performs an operation of removing the tape supporting member 56 from the case 52 in Step S14, the carrier tape TP2 is detached from the sprocket 54 and drops onto the tape conveying path 53b. This enables the sprocket 57 to intermittently convey the carrier tape TP2 in the feed direction Df and supply the component in the carrier tape TP2 to the component supplying position 50. Incidentally, the operator can mount a carrier tape TP to be used for component mounting next to the carrier tape TP2 between the sprocket 54 and the tape supporting member 56 and cause the carrier tape TP to wait by mounting the tape supporting member 56 in the case 52 again after Step S14.

In the component mounter 1 using such a tape feeder 5, the carrier tape TP to be used in the component mounting being performed is inserted into the feeder main body 51 along the tape conveying path 53b, whereas the carrier tape TP used for the next component mounting waits above the tape conveying path 53b. By performing Steps S12 to S14 every time the carrier tape TP is used up, the waiting carrier tape TP can be inserted into the feeder main body 51 along the tape conveying path 53b and used for the next component mounting.

Figure 3:
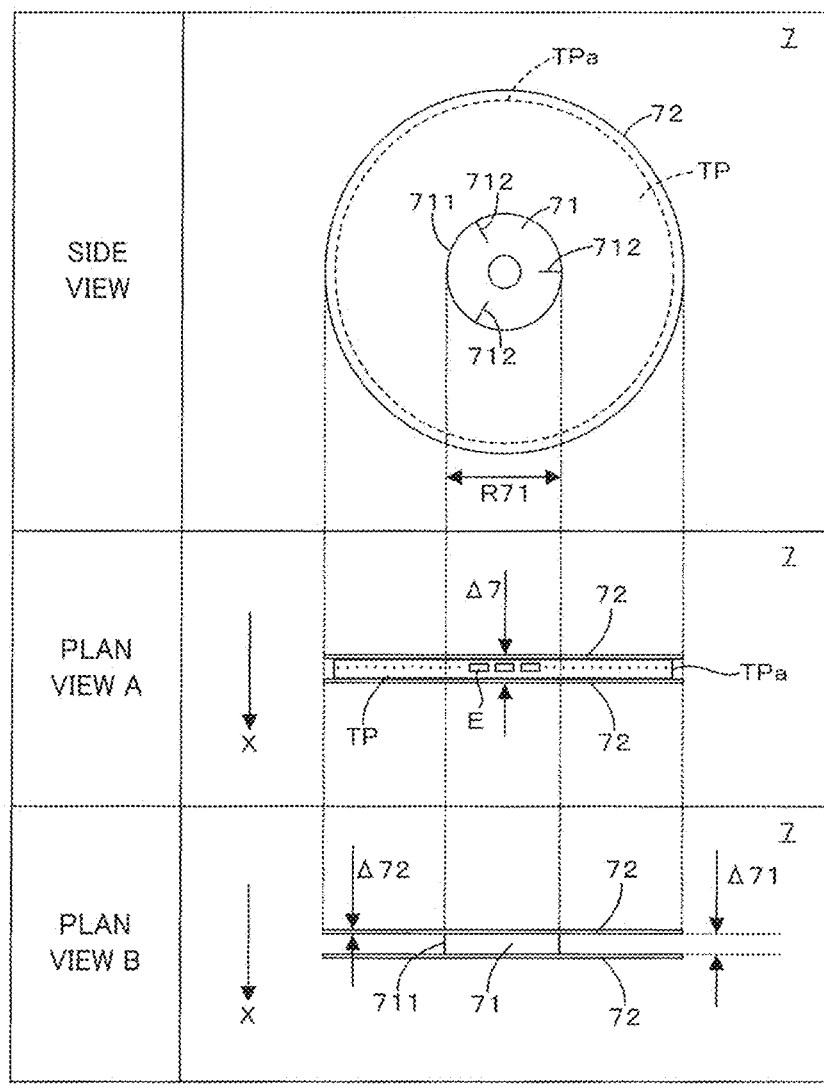
FIG. 3 is views schematically showing an example of the configuration of the reel holding the carrier tape.

FIG. 3 is views schematically showing an example of the configuration of the reel holding the carrier tape, wherein a side view and a plan view of the reel having the carrier tape wound thereon are shown in "Side View" and "Plan View A" of FIG. 3 and a plan view of the reel having no carrier tape is shown in "Plan View B" of FIG. 3. The reel 7 includes an axle 71 and two side plates 72 sandwiching the axle 71 from both sides, and has a maximum thickness Δ7 in the X direction. The axle 71 has such a shape that a plurality of slits 712 are provided in a cylindrical peripheral surface 711 having a diameter R71. The plurality of slits 712 are respectively provided to extend toward a center from the peripheral surface 711 of the axle 71, and arranged at equal intervals in a circumferential direction of the axle 71. The carrier tape TP accommodating a plurality of components E are wound on the axle 71 with the tip thereof engaged with one slit 712. Further, the respective side plates 72 have a disc shape having a thickness Δ72 and are provided concentrically with the axle 71 while being spaced in the X direction by an interval Δ71. By sandwiching the carrier tape TP wound on the axle 71 from both sides by the two side plates 72 in this way, lateral detachment of the carrier tape TP from the axle 71 is restrained. Further, an outermost part TPa of the carrier tape TP is located inwardly of the peripheral edges of the respective side plates 72 with the carrier tape TP fully wound on the reel 7. Note that various materials are assumed for the reel 7 and, for example, the reel 7 can be formed of paper, plastic material or the like.

Figure 4:
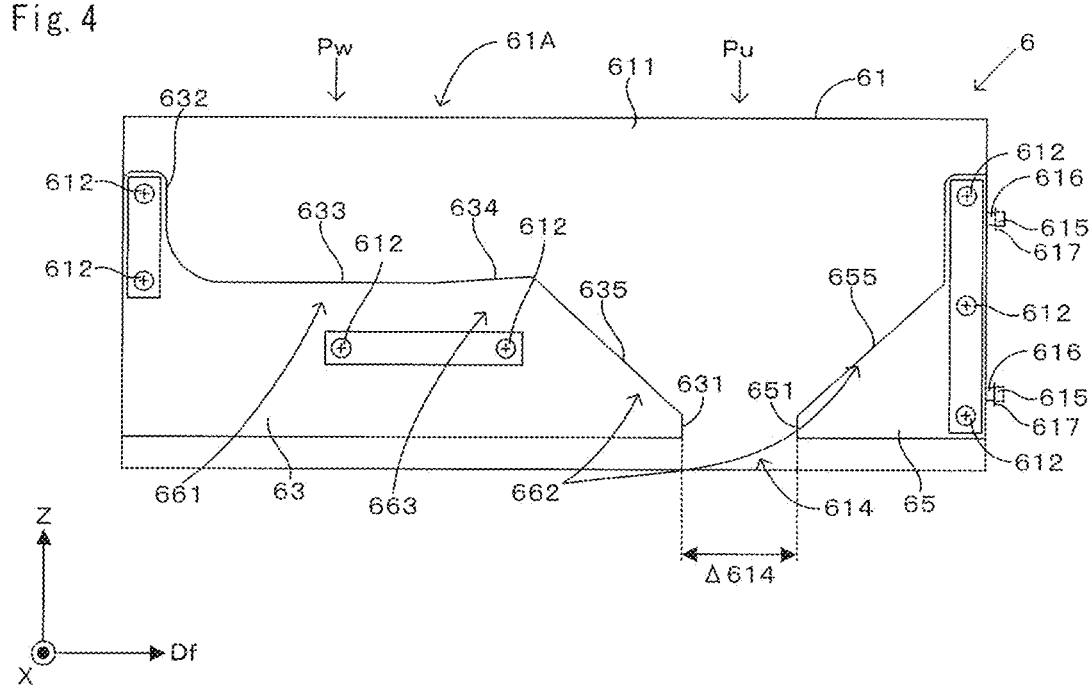
FIG. 4 is a side view schematically showing an example of the configuration of the reel holder with the reel removed.
Figure 5:
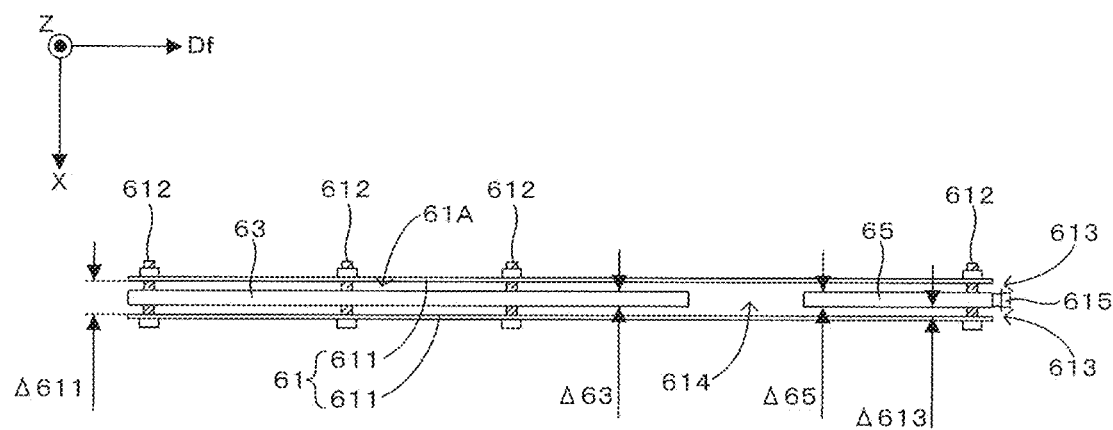
FIG. 5 is a plan view schematically showing the example of the configuration of the reel holder with the reel removed.
Figure 6:
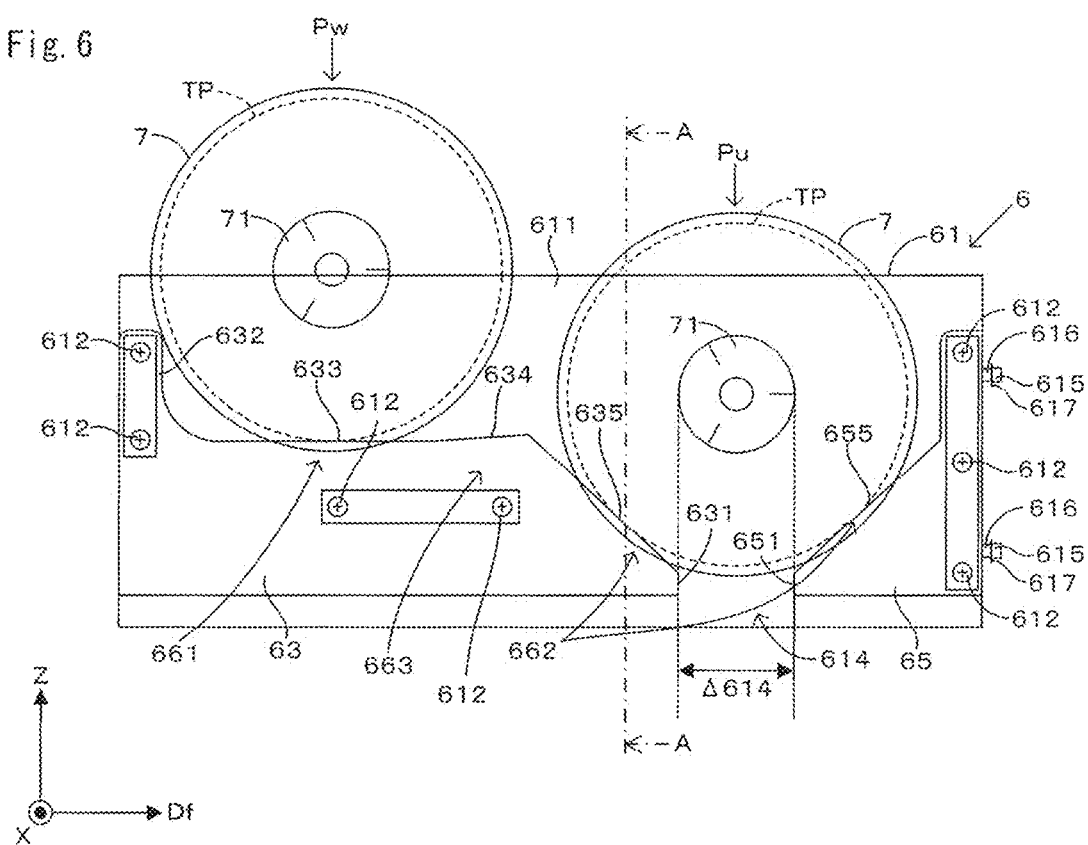
FIG. 6 is a side view schematically showing an example of the configuration of the reel holder with the reel set.
Figure 7:
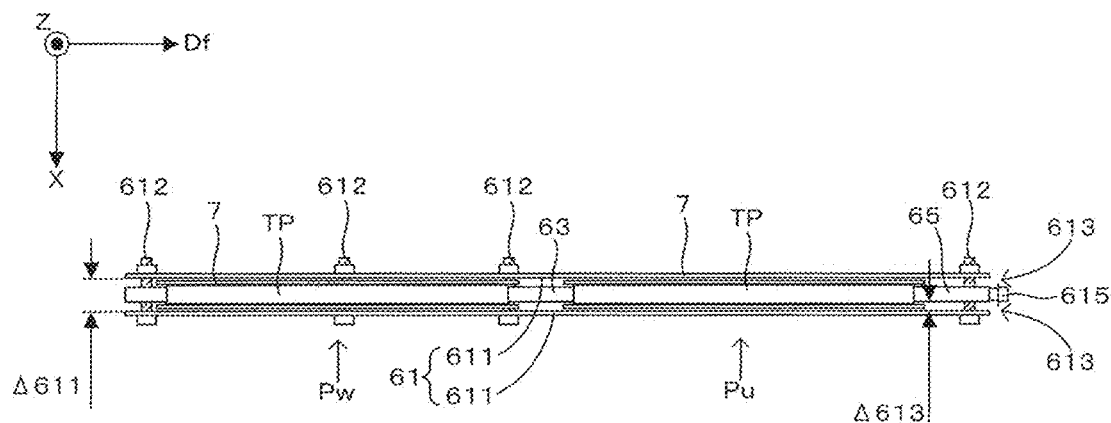
FIG. 7 is a plan view schematically showing the example of the configuration of the reel holder with the reel set.
Figure 8:
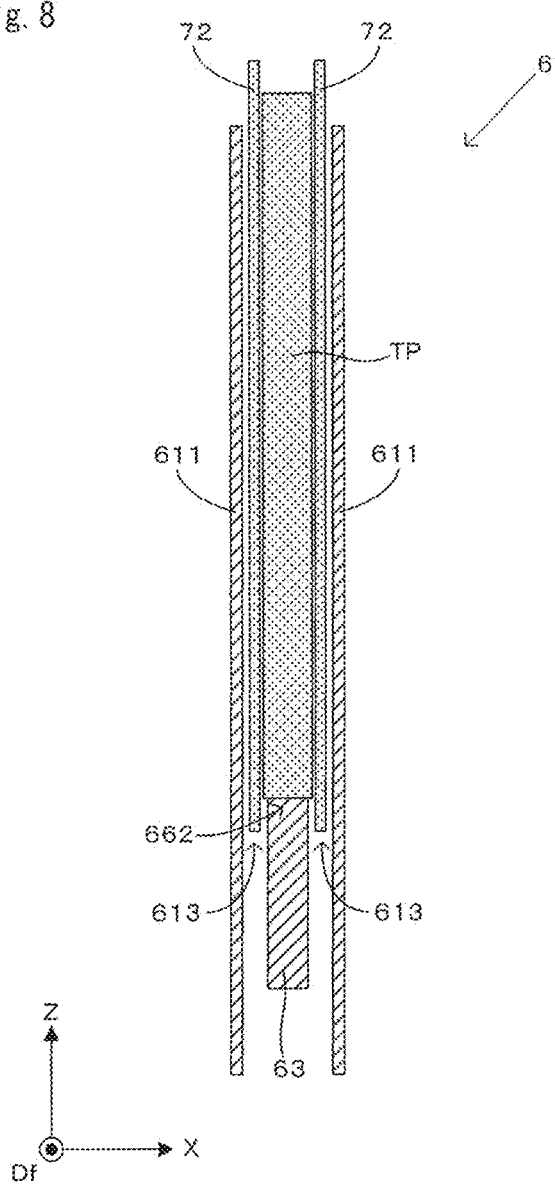
FIG. 8 is a sectional view along A-A of FIG. 6.

FIG. 4 is a side view schematically showing an example of the configuration of the reel holder with the reel removed. FIG. 5 is a plan view schematically showing the example of the configuration of the reel holder with the reel removed. FIG. 6 is a side view schematically showing an example of the configuration of the reel holder with the reel set. FIG. 7 is a plan view schematically showing the example of the configuration of the reel holder with the reel set. Further, FIG. 8 is a sectional view along A-A of FIG. 6. Note that, in FIGS. 4 and 6, the inside of the reel holder 6 is shown through a side cover 611 on a front side.

A body 61 of the reel holder 6 includes two side covers 611 spaced apart in the X direction and fastening instruments 612 which have nuts and bolts and be configured to fix the two side covers 611 to each other, and an opening 61A is open upward between the two side covers 611. An interval Δ611 between the two side covers 611 is slightly larger than the thickness Δ7 of the reel 7 and the reel 7 inserted through the opening 61A can be accommodated between these side covers 611. Further, the reel holder 6 includes two reel supporting structure 63, 65 arranged in the feed direction Df in the body 61. These reel supporting structures 63, 65 are fixed to the side covers 611 by the fastening instruments 612 while being sandwiched by the two side covers 611 in the X direction. Note that each fastening instrument 612 is arranged outside a passage range of the reel 7 moving from a standby position Pw to a use position Pu to be described later and a passage range of the reel 7 discharged from the use position Pu.

The respective reel supporting structures 63, 65 have the same thicknesses Δ63, Δ65 slightly smaller than the interval Δ71 between the two side plates 72 of the reel 7. Further, clearances 613 are defined in the X direction between the reel supporting structures 63, 65 and the respective side covers 611, and each clearance 613 has a thickness Δ613 slightly larger than the thickness Δ72 of the side plates 72 of the reel 7 in the X direction. Thus, as shown in FIGS. 6, 7 and 8, the reel supporting structure 63, 65 can be brought into contact with the carrier tape TP from below in a state where the reel supporting structure 63, 65 is fitted between the two side plates 72 of the reel 7 while the respective side plates 72 of the reel 7 are fitted in the respective clearances 613. That is, the reel supporting structure 63, 65 can support the axle 71 of the reel 7 against the force of gravity by coming into contact with the carrier tape TP wound on the axle 71 of the reel 7. In this way, the upper ends of the reel supporting structures 63, 65 function as rails configured to support or guide the reel 7 while being fitted into the reel.

These reel supporting structures 63, 65 are spaced apart in the feed direction Df, and a space between the reel supporting structures 63, 65 functions as a discharge opening 614 configured to discharge the axle 71 of the reel 7 having the carrier tape TP used up. That is, a width Δ614 of the discharge opening 614 is equal to or slightly larger than the diameter R71 of the axle 71 of the reel 7 in the feed direction Df and the axle 71 of the reel 7 can exit through the discharge opening 614 in the Z direction. Further, side ends of the respective reel supporting structures 63, 65 adjacent to the discharge opening 614 in the feed direction Df, i.e. a front end 631 of the reel supporting structure 63 and a back end 651 of the reel supporting structure 65 are parallel to the Z direction, so that the axle 71 of the reel 7 can smoothly exit through the discharge opening 614. Note that the width Δ614 of the discharge opening 614 in the feed direction Df is smaller than a roll diameter of the carrier tape TP wound only one turn on the axle 71 to suppress the exit of the axle 71 through the discharge opening 614 in a state where the carrier tape TP remains.

Such reel supporting structures 63, 65 can support the reel 7 at each of the use position Pu facing the discharge opening 614 from above and the standby position Pw behind the use position Pu in the feed direction Df. That is, a rear end part of the reel supporting structure 63 constitutes a standby reel supporting part 661 configured to support the reel 7 located at the standby position Pw, a front end part of the reel supporting structure 63 and the reel supporting structure 65 constitute a use reel supporting part 662 configured to support the reel 7 located at the use position Pu, and a central part of the reel supporting structure 63 between the standby reel supporting part 661 and the use reel supporting part 662 constitutes a reel guide part 663 configured to guide a movement of the reel 7 from the standby reel supporting part 661 to the use reel supporting part 662. The detailed configurations of the reel supporting structures 63, 65 are as follows.

The reel supporting structure 63 includes a convex part 632 projecting upward on the back end in the feed direction Df to prevent the reel 7 located at the standby reel Pw from jumping out backward in the feed direction Df. Further, the reel supporting structure 63 includes an extended part 633 horizontally extending forward in the feed direction Df from the lower end of the convex part 632. A part of this extended part 633 located right below the axle 71 of the reel 7 at the standby position Pw functions as the standby reel supporting part 661 and supports the reel 7 against the force of gravity by being held in contact with the carrier tape TP wound on the reel 7 at the standby position Pw from below.

Further, the reel supporting structure 63 includes a slope part 634 slightly inclined upwardly as extending forward from the front end of the extended part 633 in the feed direction Df. It is suppressed by the slope part 634 that the reel 7 at the standby position Pw jumps out forward in the feed direction Df due to an external impact or the like. Furthermore, the reel supporting structure 63 includes a slope part 635 inclined downwardly as extending forward from the front end of the slope part 634 in the feed direction Df and reaching the back end of the discharge opening 614. On the other hand, the reel supporting structure 65 includes a slope part 655 inclined upwardly as extending forward from the front end of the discharge opening 614 in the feed direction Df. Out of these slope parts 635, 655, parts held in contact with the carrier tape TP wound on the reel 7 at the use position Pu function as the use reel supporting part 662 and support the reel 7 at the use position Pu against the force of gravity. Further, out of the extended part 633, the slope part 634 and the slope part 635, parts extending from the standby reel supporting part 661 to the use reel supporting part 662 function as the reel guide part 663 and guide a movement of the reel 7 from the standby position Pw to the use position Pu.

Further, two engagement projections 615 are arranged in the Z direction on the front end of the reel supporting structure 65 in the feed direction Df. Each engagement projection 615 includes a cylindrical part 616 projecting forward in the feed direction Df and a flange part 617 protruding from the cylindrical part 616. The reel holder 6 is removably attached to the feeder mounting carriage 4 by the engagement projections 615.

Figure 9:
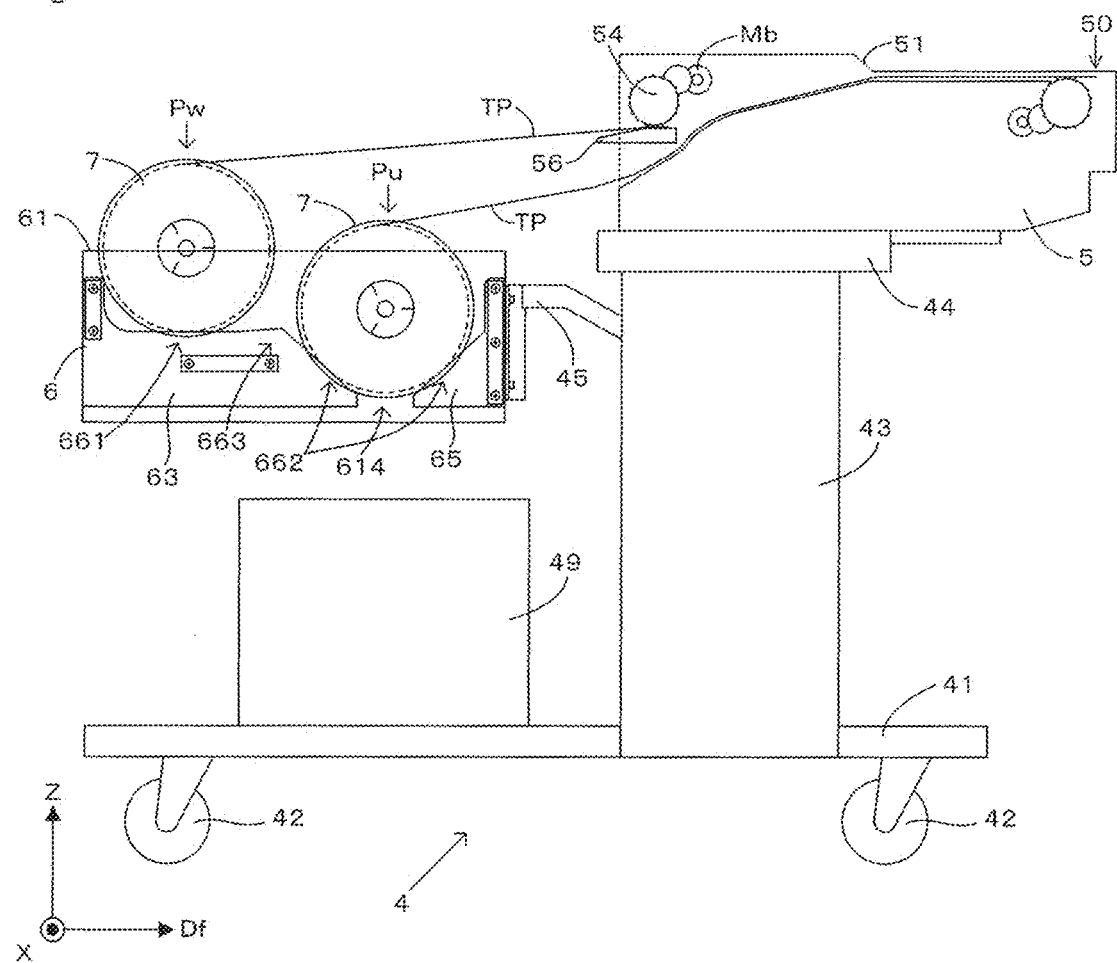
FIG. 9 is a side view schematically showing the feeder mounting carriage having the tape feeders and the reel holders attached thereto.

FIG. 9 is a side view schematically showing the feeder mounting carriage having the tape feeders and the reel holders attached thereto. The feeder mounting carriage 4 includes a horizontally arranged bottom plate 41 and casters 42 configured to support the bottom plate 41 with respect to a ground surface. Further, the feeder mounting carriage 4 includes a supporting frame 43 standing on a front part of the bottom plate 41 in the feed direction Df, a feeder attaching part 44 provided on the upper end of the supporting frame 43 and a reel holder attaching part 45 extending backward in the feed direction Df from the supporting frame 43. The tape feeders 5 are removably attached to the feeder attaching part 44, and the reel holders 6 are removably attached to the rear end of the reel holder attaching part 45. Further, a reel collection container 49 is placed on the bottom plate 41 at a position right below the discharge openings 614 of the reel holders 6 attached to the reel holder attaching part 45, so that the reels 7 discharged from the discharge openings 614 can be collected into the reel collection container 49.

Figure 10:
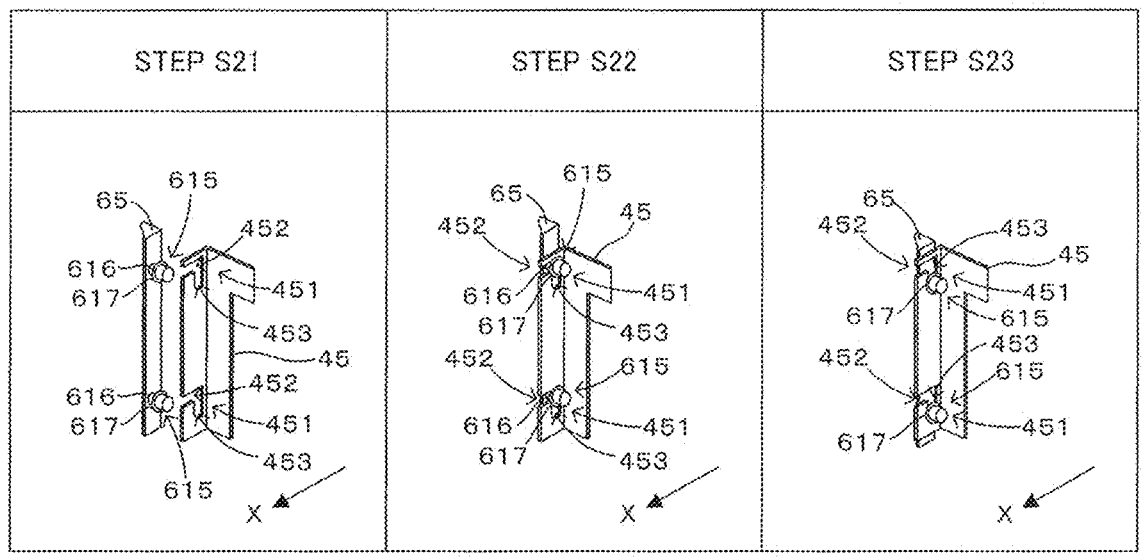
FIG. 10 is perspective views schematically showing an example of an attaching structure of the reel holder and the reel holder attaching part.

FIG. 10 is perspective views schematically showing an example of an attaching structure of the reel holder and the reel holder attaching part. Two engagement holes 451 are arranged at the same interval as that of the two engagement projections 615 in the Z direction on a rear end part of the reel holder attaching part 45. Each engagement hole 451 includes a lead-in part 452 having one end open laterally and extending in the X direction and an engagement part 453 extending downward from the other end of the lead-in part 452, and both the lead-in part 452 and the engagement part 453 have a width wider than the cylindrical part 616 and narrower than the flange part 617 of the engagement projection 615. The cylindrical part 616 of each engagement projection 615 is caused to face the opening of the lead-in part 452 of each engagement hole 451 in the X direction (Step S21), and be inserted into the lead-in part 452 of each engagement hole 451 (Step S22). Further, the cylindrical part 616 of each engagement projection 615 is caused to drop onto the engagement part 453 of each engagement hole 451, whereby the engagement projection 615 and the engagement hole 451 are engaged and the reel holder 6 can be attached to the reel holder attaching part 45 (Step S23). Further, the reel holder 6 can be removed from the reel holder attaching part 45 by performing an operation opposite to that of Steps S21 to S23.

Figure 11:
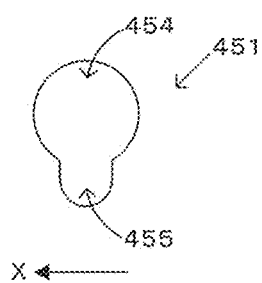
FIG. 11 is a diagram schematically showing a modification of the engagement hole of the reel holder attaching part.

Note that various configurations of such an engagement hole 451 are possible and the engagement hole 451 may be configured as shown in FIG. 11. FIG. 11 is a diagram schematically showing a modification of the engagement hole of the reel holder attaching part. This engagement hole 451 includes a lead-in part 454 wider than the flange part 617 of the engagement projection 615 and an engagement part 455 wider than the cylindrical part 616 and narrower than the flange part 617 of the engagement projection 615. By causing the cylindrical part 616 of the engagement projection 615 to drop onto the engagement part 455 after the engagement projection 615 is inserted into the lead-in part 454 of the engagement hole 451, the engagement projection 615 and the engagement hole 451 can be engaged and the reel holder 6 can be attached to the reel holder attaching part 45.

In the component mounter 1 using such a reel holder 6, the carrier tape TP wound on the reel 7 held at the use position Pu can be used for the component mounting and the reel 7 on which the carried tape TP to be used for the next component mounting is wound can be caused to wait at the standby position Pw. Next, functions of this reel holder 6 are described.

Figure 12:
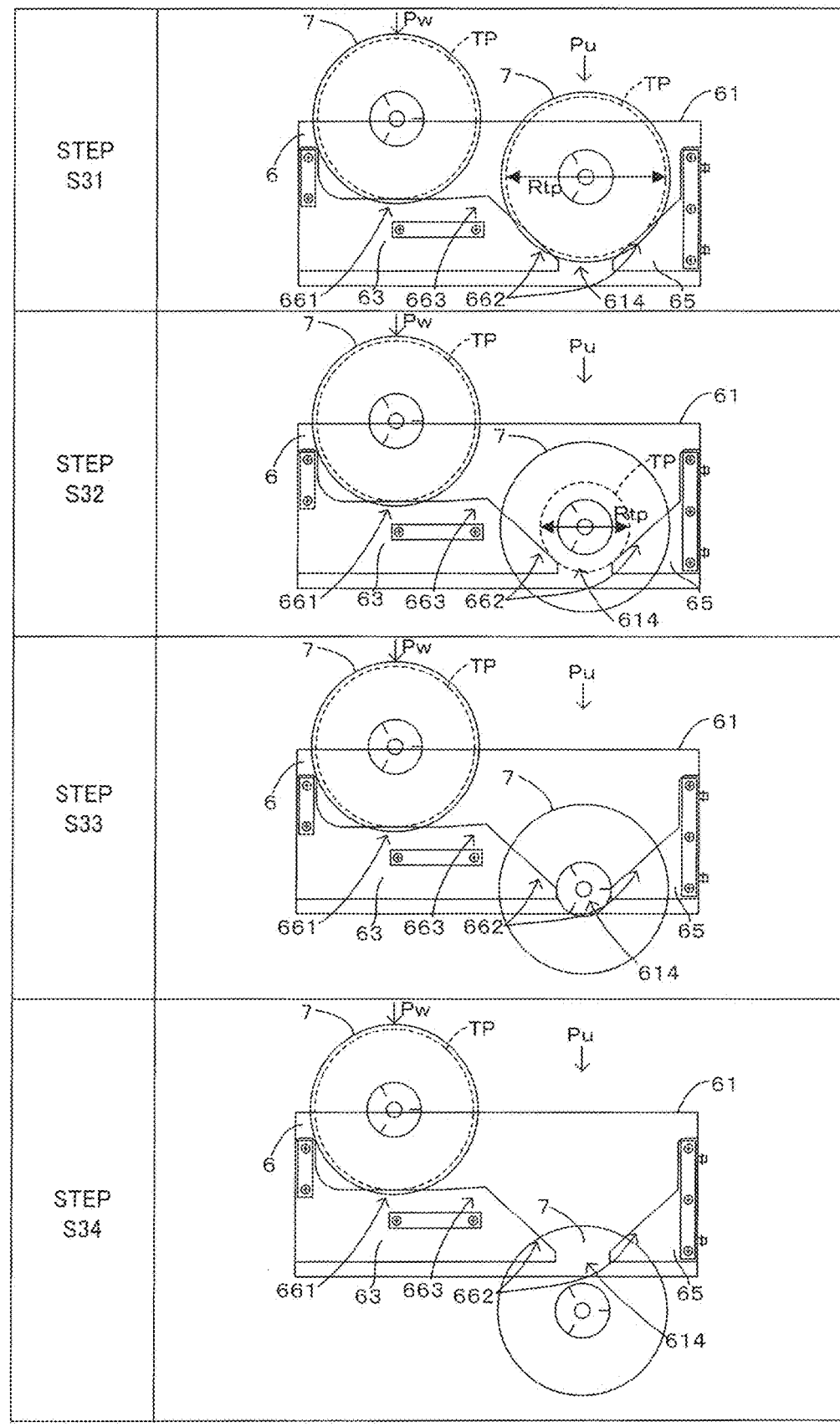
FIG. 12 is side views schematically showing a first example of the function of the reel holder.

FIG. 12 is side views schematically showing a first example of the function of the reel holder. Note that the carrier tape TP withdrawn from the reel 7 and moving toward the tape feeder 5 is not shown in FIG. 12. In Step S31, the reel 7 having the carrier tape TP fully wound thereon is held at each of the use position Pu and the standby position Pw. Particularly, a roll diameter Rtp of the carrier tape TP wound on the reel 7 at the use position Pu is larger than the width Δ614 of the discharge opening 614 in the X direction and the slope parts 635, 655 constituting the use reel supporting part 662 support the axle 71 of the reel 7 by being held in contact with the roll outer periphery of the carrier tape TP.

When the component mounting is started, the carrier tape TP is intermittently withdrawn from the reel 7 held at the use position Pu. Along with this, as shown in a field of Step S32, the roll diameter Rtp of the carrier tape TP wound on the reel 7 held at the use position Pu decreases and the axle 71 of the reel 7 is gravitationally gradually displaced downwardly at the use position Pu. In this way, the axle 71 of the reel 7 is guided to the discharge opening 614 by the slope parts 635, 655 with a reduction of the carrier tape TP while being supported from both sides in the feed direction Df by the slope parts 635, 633 inclined downwardly toward the discharge opening 614.

Note that the slope part 655 configured to support the axle 71 of the reel 7 from front in the feed direction Df also exhibits the following functions in addition to the function of guiding the axle 71 to the discharge opening 614 by being shaped to be inclined upwardly toward the front in the feed direction Df. That is, a force acts on the reel 7 in the feed direction Df by the tape feeder 5 pulling the carrier tape TP withdrawn from the reel 7 at the use position Pu in the feed direction Df. However, since the upwardly inclined slope part 655 is provided in the feed direction Df of the reel 7, the reel 7 rotates (revolves) at the use position Pu without moving in the feed direction Df from the use position Pu. That is, the slope part 655 exhibits a function of stably holding the reel 7 at the use position Pu regardless of a force from the tape feeder 5.

When the carrier tape TP wound on the reel 7 at the use position Pu is used up, the slope parts 635, 655 cause the axle 71 of this reel 7 to reach the discharge opening 614 (Step S33). Then, the axle 71 having reached the discharge opening 614 exits from the discharge opening 614 by its own weight and the reel 7 is discharged from the reel holder 6 (Step S34). At this time, the discharged reel 7 drops into the aforementioned reel collection container 49 (FIG. 9). If the use position Pu is emptied in this way, the reel holder 6 guides the reel 7 waiting at the standby position Pw to the use position Pu by the following function.

Figure 13:
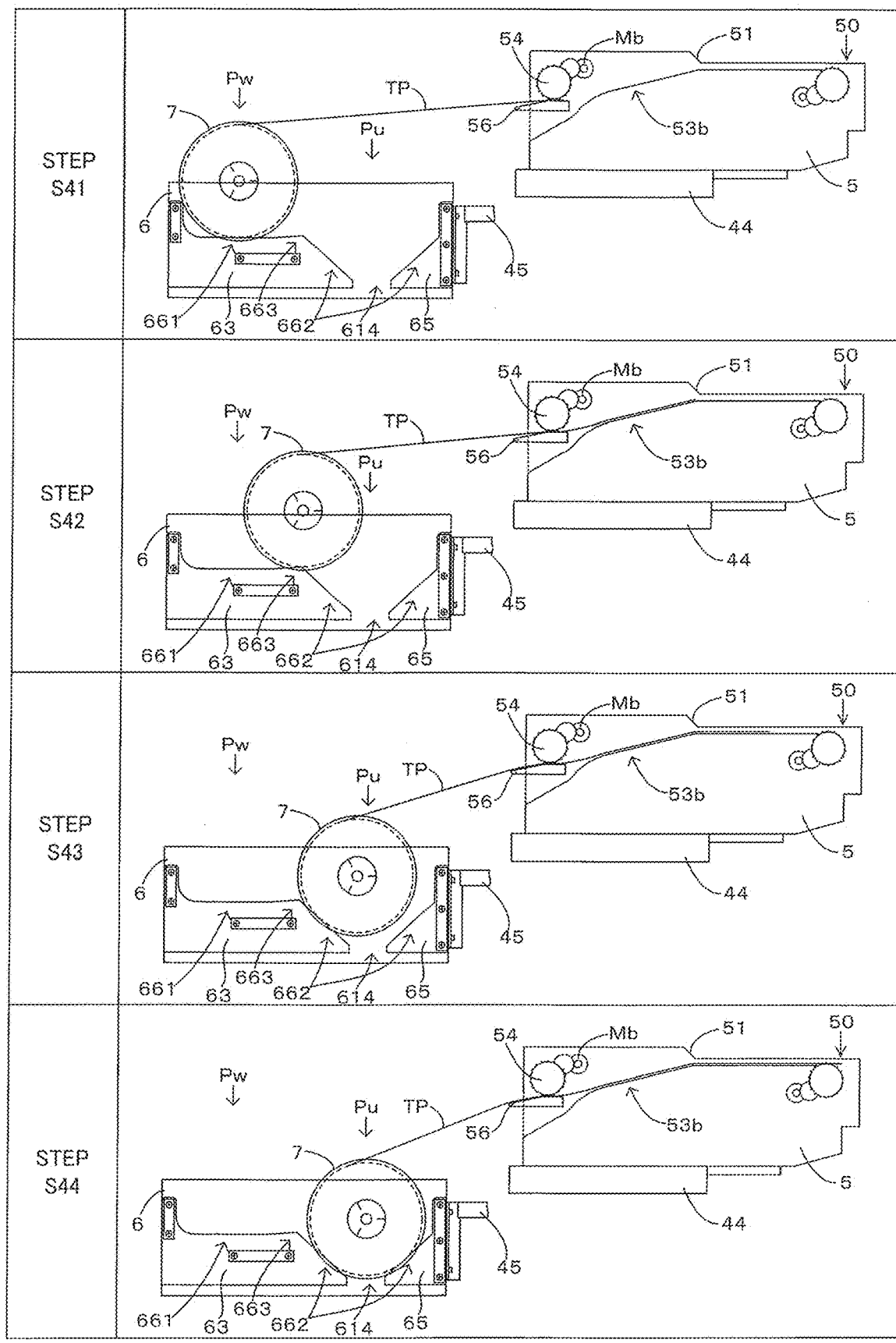
FIG. 13 is side views schematically showing a second example of the function of the reel holder.

FIG. 13 is side views schematically showing a second example of the function of the reel holder. As shown in a field of Step S41, the reel 7 on which the carrier tape TP having the tip mounted in the tape feeder 5 is wound is supported at the standby position Pw. That is, the tip of the carrier tape TP withdrawn from the reel 7 at the standby position Pw is sandwiched between the sprocket 54 of the tape feeder 5 and the tape supporting member 56.

The tape feeder 5 starts the loading described using FIG. 2 when the carrier tape TP on the reel 7 located at the use position Pu is used up. As a result, the reel 7 waiting at the standby position Pw starts moving in the feed direction Df from the standby position Pw by receiving a force in the feed direction Df applied from the tape feeder 5 via the carrier tape TP. The movement of the reel 7 in the feed direction Df is guided from the standby position Pw to the use position Pu by the reel guide part 663 fitted between the two side plates 72 of the reel 7 (Steps S42, S43). As a result, the reel 7 reaches the use position Pu at a time when or before the loading is completed (Step S44).

Incidentally, when the loading is completed, the operator removes the tape supporting member 56 from the case 52 and aligns the carrier tape TP withdrawn from the reel 7 at the use position Pu along the tape conveying path 53b. Subsequently, the operator sets a new reel 7 at the standby position Pw and sandwiches the tip of a carrier tape TP withdrawn from this reel 7 between the sprocket 54 of the tape feeder 5 and the tape supporting member 56.

As described above, in this embodiment, the axle 71 of the reel 7 is supported against the force of gravity on the slope parts 635 and 655 abutting on the carrier tape TP wound around the axle 71 of the reel 7. In this support supporting configuration, as the carrier tape TP is pulled out from the reel 7 to reduce the amount of the carrier tape TP wound around the axle 71, the axle 71 is displaced under the force of gravity. Further, the reel holder 6 guides this displacement of the axle 71 to the discharge opening 614 by the slope parts 635 and 655 to make the axle 71 without the carrier tape TP reach the discharge opening 614. In this way, the axle 71 reaches the discharge opening 614 automatically in response to reduction of the amount of the carrier tape TP, so that the reel 7 can be discharged from the reel holder 6 thereafter only by making the axle 71 exit through the discharge opening 614.

In particular, the reel holder 6 of this embodiment has the configuration of making the axle 71 exit through the discharge opening 614 after the axle 71 without the carrier tape TP reaches the discharge opening 614. Thus, after the carrier tape TP around the reel 7 is used up, the reel 7 is discharged automatically from the reel holder 6 without requiring operation by an operator. This makes it possible to more effectively reduce operator's burden in removing the reel 7.

More specifically, the width Δ614 of the discharge opening 614 is equal to or more than the diameter R71 (outer diameter) of the axle 71 or more. The reel holder 6 makes the axle 71 exit through the discharge opening 614 under the weight of the axle 71 after the axle 71 without the carrier tape TP reaches the discharge opening 614. By this simple configuration, the axle 71 is allowed to exit through the discharge opening 614 to discharge the reel 7 from the reel holder 6.

Provided is the reel collection container 49 configured to collect the reel 7 which is discharged from the reel holder 6 as the axle 71 exits through the discharge opening 614. This makes it possible to reduce the occurrence of littering with the reel 7 discharged from the reel holder 6.

Next, a modification of the reel holder 6 is described. Note that the following description is centered on different parts from the reel holder 6 according to the above embodiment and common parts are denoted by corresponding reference signs and the description thereof is omitted as appropriate. However, it goes without saying that similar effects can be exhibited by having a configuration common to the above embodiment also in the following modification.

Figure 14:
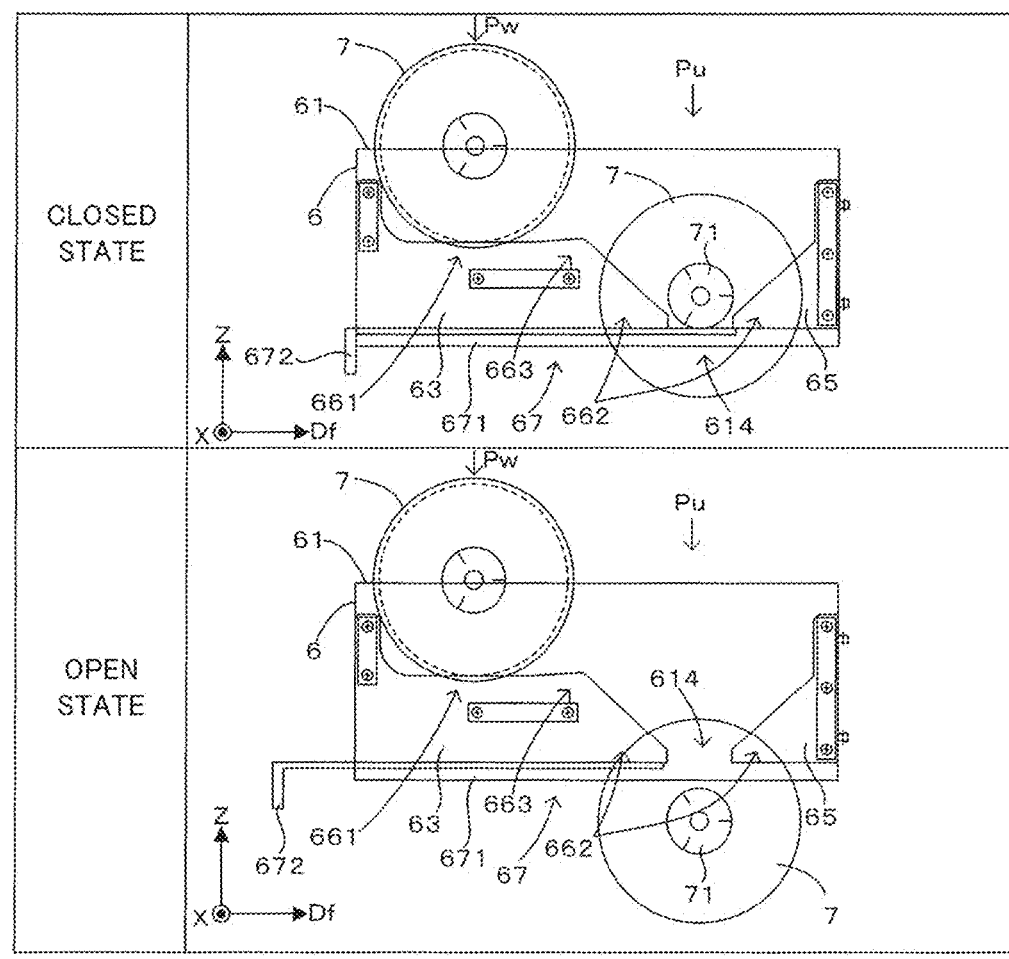
FIG. 14 is side views schematically showing a first modification of the reel holder.

FIG. 14 is side views schematically showing a first modification of the reel holder. This reel holder 6 includes a shutter member 67 provided on a bottom part of a reel supporting structure 63. This shutter member 67 includes a slide part 671 attached to the bottom part of the reel supporting structure 63 slidably in the feed direction Df and a handle 672 provided on the back end of the slide part 671 in the feed direction Df. This shutter member 67 can be selectively in a closed state where a discharge opening 614 is closed from below by the slide part 671 by being located on a front side in the feed direction Df and in an open state where the slide part 671 is removed from the discharge opening 614 to open the discharge opening 614 by being located on a back side in the feed direction Df. The exit of the axle 71 through the discharge opening 614 is regulated in the closed state, whereas the exit of the axle 71 through the discharge opening 614 is permitted in the open state. In such a configuration, an operator can adjust a discharge timing of the reel 7 from the reel holder 6 by operating the handle 672 and opening/closing the shutter member 67. Thus, for example, in the case of removing the reel collection container 49 from the feeder mounting carriage 4 to discard the reels 7 accumulated in the reel collection container 49, the discharge of the reel 7 can be regulated by closing the shutter member 67.

Figure 15:
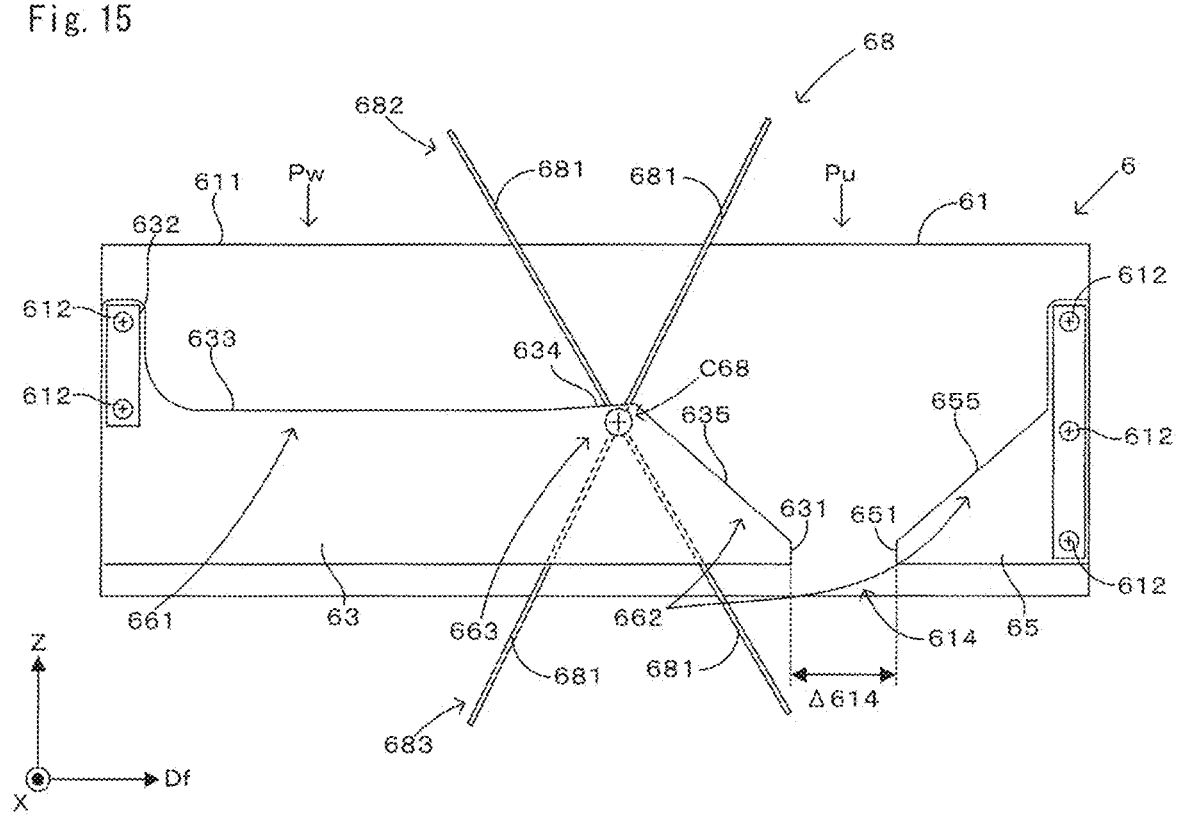
FIG. 15 is a side view schematically showing a second modification of the configuration of the reel holder with the reel removed.
Figure 16:
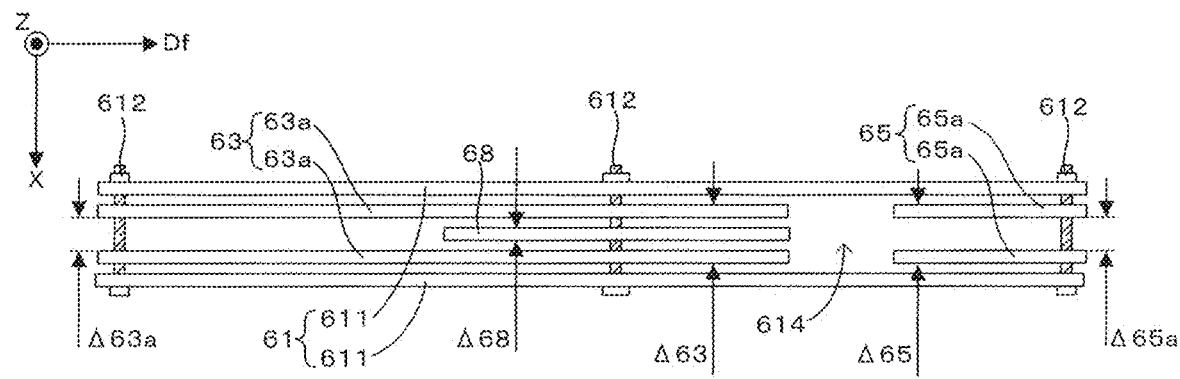
FIG. 16 is a plan view schematically showing the second modification of the configuration of the reel holder with the reel removed.
Figure 17:
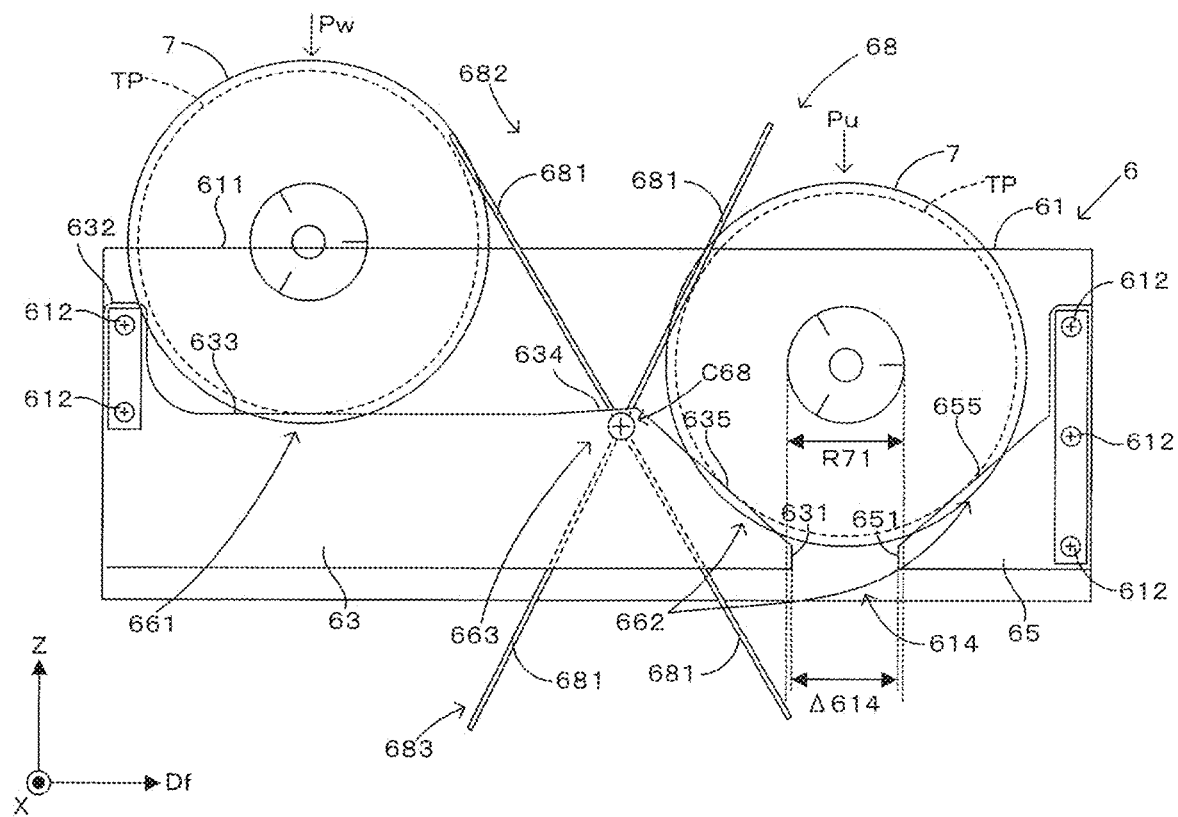
FIG. 17 is a side view schematically showing the second modification of the configuration of the reel holder with the reel set.
Figure 18:
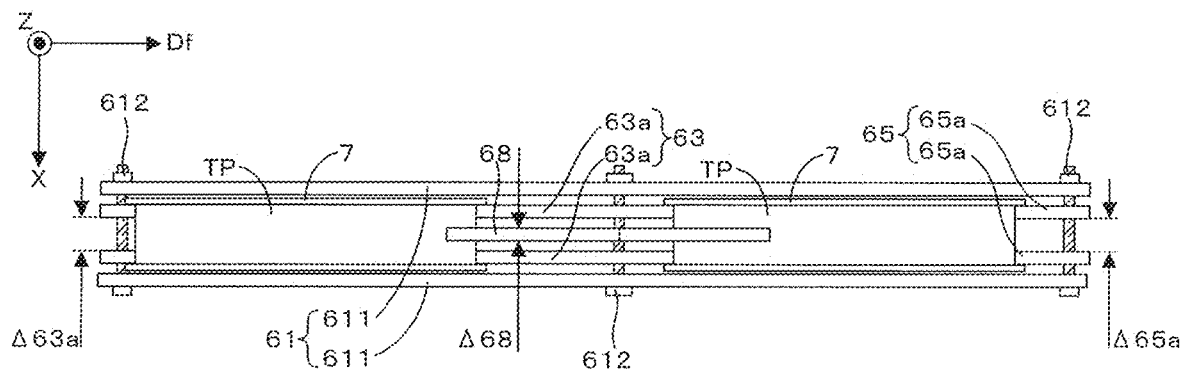
FIG. 18 is a plan view schematically showing the second modification of the configuration of the reel holder with the reel set.

FIG. 15 is a side view schematically showing a second modification of the configuration of the reel holder with the reel removed. FIG. 16 is a plan view schematically showing the second modification of the configuration of the reel holder with the reel removed. FIG. 17 is a side view schematically showing the second modification of the configuration of the reel holder with the reel set. FIG. 18 is a plan view schematically showing the second modification of the configuration of the reel holder with the reel set. Note that, in FIGS. 15 and 17, the inside of the reel holder 6 is shown through a side cover 611 on a front side.

A main difference between the second modification of the reel holder 6 and the above embodiment is that the diameter R71 of the axle 71 of the reel 7 is larger than a width Δ614 of a discharge opening 614 of the reel holder 6 in the X direction and the axle 71 of the reel 7 having no more carrier tape TP cannot exit through the discharge opening 614 by its own weight. Accordingly, the reel holder 6 according to the second modification includes a configuration for pushing out the axle 71 of the reel 7 through the discharge opening 614.

A reel supporting structure 63 of this reel holder 6 includes two supporting plates 63a arranged at an interval Δ63a in the X direction. Similarly, a reel supporting structure 65 of this reel holder 6 includes two supporting plates 65a arranged at an interval Δ65a (equal to Δ63a) in the X direction. The reel holder 6 includes an axle ejecting part 68 arranged between the two supporting plates 63a in the X direction. This axle ejecting part 68 has such an outer shape that two ejecting rods 681 intersect with each other in centers thereof and is supported by a fastening instrument 612 in an intersecting part of the two ejecting rods 681. As just described, the axle ejecting part 68 has a width Δ68 smaller than the interval Δ63a in the X direction and is mounted rotatably with respect to a body 61 between the two supporting plates 63a and between the two supporting plates 65a.

Such an axle ejecting part 68 includes a blade 682 constituted by one end parts of the two ejecting rods 681 at an acute angle on one side of a rotation center C68 and a blade 683 constituted by the other end parts of the two ejecting rods 681 at an acute angle on the other side of the rotation center C68. The rotation center C68 of the axle ejecting part 68 is located between the standby position Pw and the use position Pu in the feed direction Df. According to a rotating state of the axle ejecting part 68, either one of the blades 682, 683 projects upward from the reel supporting structure 63 and located between the standby position Pw and the use position Pu.

Figure 19:
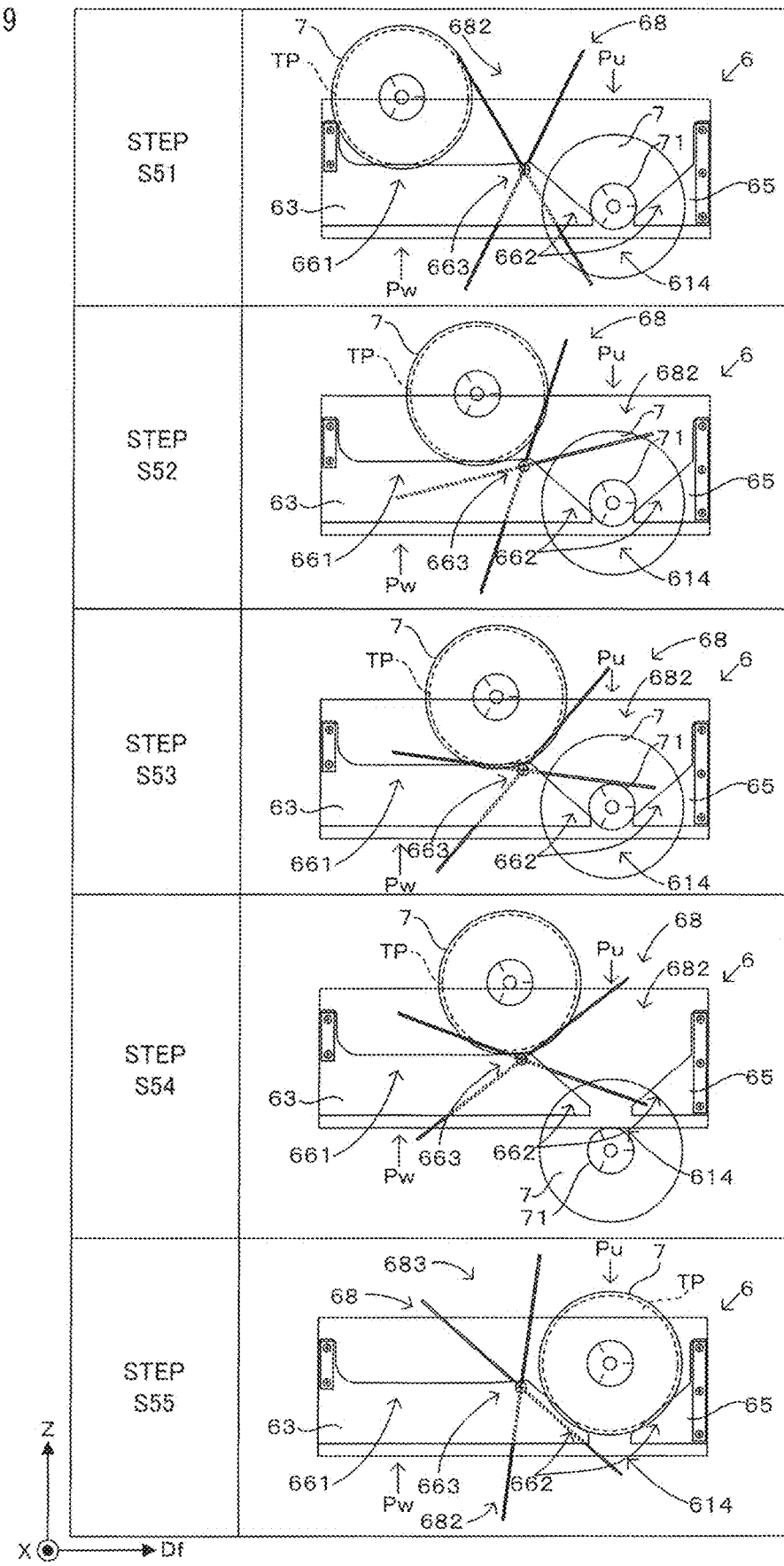
FIG. 19 is side views schematically showing the operation of the reel holder according to the second modification.

FIG. 19 is side views schematically showing the operation of the reel holder according to the second modification. Note that the carrier tape TP withdrawn from the reel 7 and moving toward the tape feeder 5 is not shown in FIG. 19. In Step S51, the carrier tape TP wound on the reel 7 at the use position Pu is used up and the axle 71 of the reel 7 at the use position Pu has reached the discharge opening 614. When the loading by the tape feeder 5 is started, the reel 7 waiting at the standby position Pw starts moving toward the use position Pu in the feed direction Df (Step S52). Further, the reel 7 moving toward the use position Pu in the feed direction Df comes into contact with the blade 682 of the reel holder 6 from behind in the feed direction Df to rotate the blade 682 in the feed direction Df. As a result, the blade 682 comes into contact with the axle 71 of the reel 7 having reached the discharge opening 614 from above (Step S53). Further, the reel 7 pulled out from the tape feeder 5 and moving in the feed direction Df further rotates the blade 682, and the axle 71 of the reel 7 is pushed out through the discharge opening 614 by the blade 682 (Step S54). At this time, the axle 71 exits through the discharge opening 614 as at least one of the axle 71 of the reel 7, a front end 631 and a rear end 651 of the reel supporting structures 63, 65 specifying the discharge opening 614 is deformed. Then, a new reel 7 having a carrier tape TP fully wound thereon reaches the use position Pu (Step S55).

As described above, the reel holder 6 includes the axle ejecting part 68 that makes the axle 71 exit through the discharge opening 614 by ejecting the axle 71 which has had no carrier tape TP and reached the discharge opening 614. Thus, even if the axle 71 is wider than the discharge opening 614, the axle 71 is still allowed to exit through the discharge opening 614 reliably.

Incidentally, in the second modification, the axle ejecting part 68 is rotated, utilizing a force of the motor Mb of the tape feeder 5 to pull the carrier tape TP during the loading. However, a motor configured to rotate the axle ejecting part 68 may be provided separately from the motor Mb.

Figure 20:
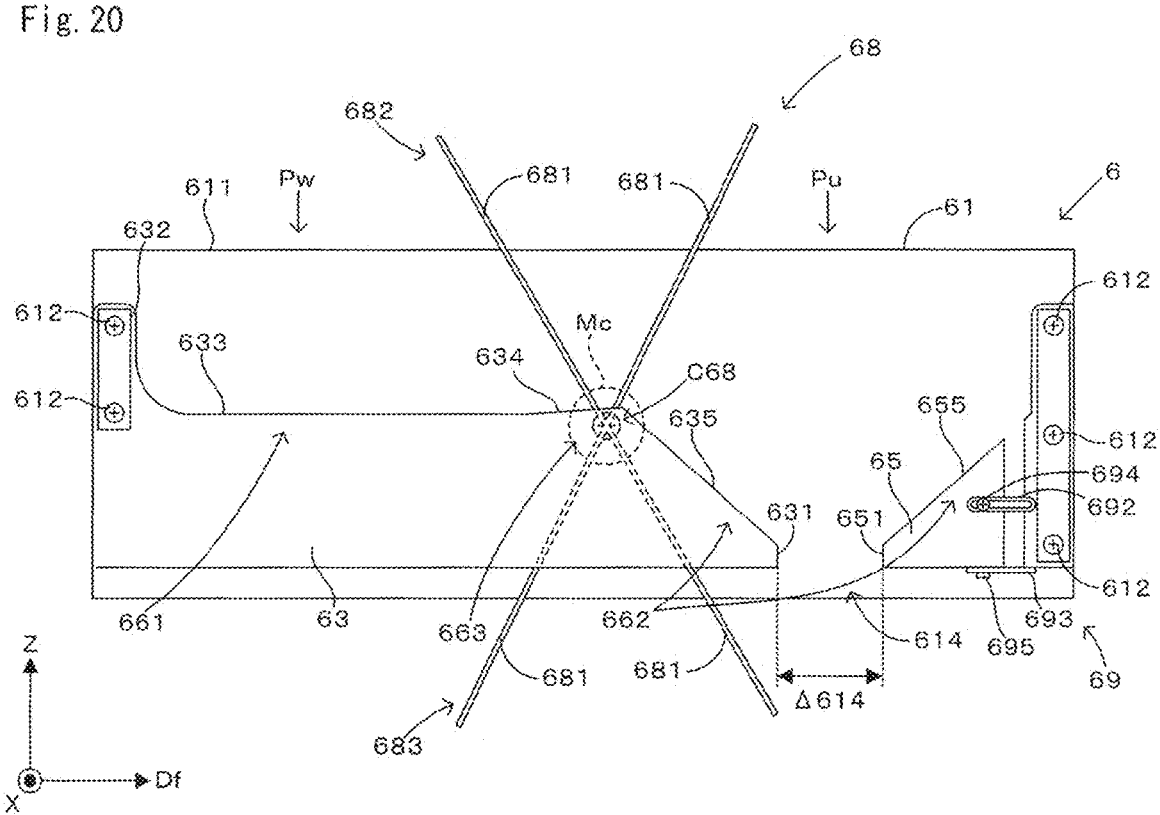
FIG. 20 is a side view schematically showing a third modification of the reel holder with the reel removed.

FIG. 20 is a side view schematically showing a third modification of the reel holder with the reel removed. This reel holder 6 includes a motor Mc configured to rotate the axle ejecting part 68. The axle ejecting part 68 rotates in response to driving force from the motor Mc, thereby allowing the axle 71 of the reel 7 to be discharged through the discharge opening 614.

Further, this reel holder 6 includes a configuration for adjusting a width Δ614 of the discharge opening 614 in the feed direction Df. That is, this reel holder 6 includes a supporting mechanism 69 configured to support a reel supporting structure 65 on a front end in the feed direction Df. This supporting mechanism 69 includes a base frame 691 fixed to the front end of the body 61 in the feed direction Df by fastening instruments 612 and extending in the Z direction and two guide frames 692, 693 extending backward in the feed direction Df from the base frame 691. Guide grooves extending in the feed direction Df penetrate through these guide frames 692, 693, the guide frame 692 supports the reel supporting structure 65 in the X direction and the guide frame 693 supports the reel supporting structure 65 from below. Further, the supporting mechanism 69 includes a screw 694 to be inserted into the guide groove of the guide frame 692 and threadably engaged with a side surface of the reel supporting structure 65 and a screw 695 to be inserted into the guide groove of the guide frame 693 and threadably engaged with a bottom surface of the reel supporting structure 65.

Accordingly, the operator can move the position of the reel supporting structure 65 in the feed direction Df with the screws 694, 695 loosened. Further, the reel supporting structure 65 can be fixed to the guide frames 692, 693 by screwing the screws 694, 695 into the reel supporting structure 65. That is, the width Δ614 of the discharge opening 614 in the feed direction Df can be adjusted by adjusting the position of the reel supporting structure 65 in the feed direction Df. This enables various reels 7 having different diameters R71 (outer diameters) of axles 71 to be properly held and discharged.

Particularly, the width Δ614 of the discharge opening 614 can be adjusted by moving the reel supporting structure 65 out of the two reel supporting structures 63, 65 arranged across the discharge opening 614. Thus, the width Δ614 of the discharge opening 614 can be adjusted by a simple operation of moving the reel supporting structure 65. Note that although the width Δ614 of the discharge opening 614 is adjusted by a movement of the reel supporting structure 65 here, the width Δ614 of the discharge opening 614 may be adjusted by a movement of the reel supporting structure 63 or by a movement of each of the reel supporting structures 63, 65.

Figure 21:
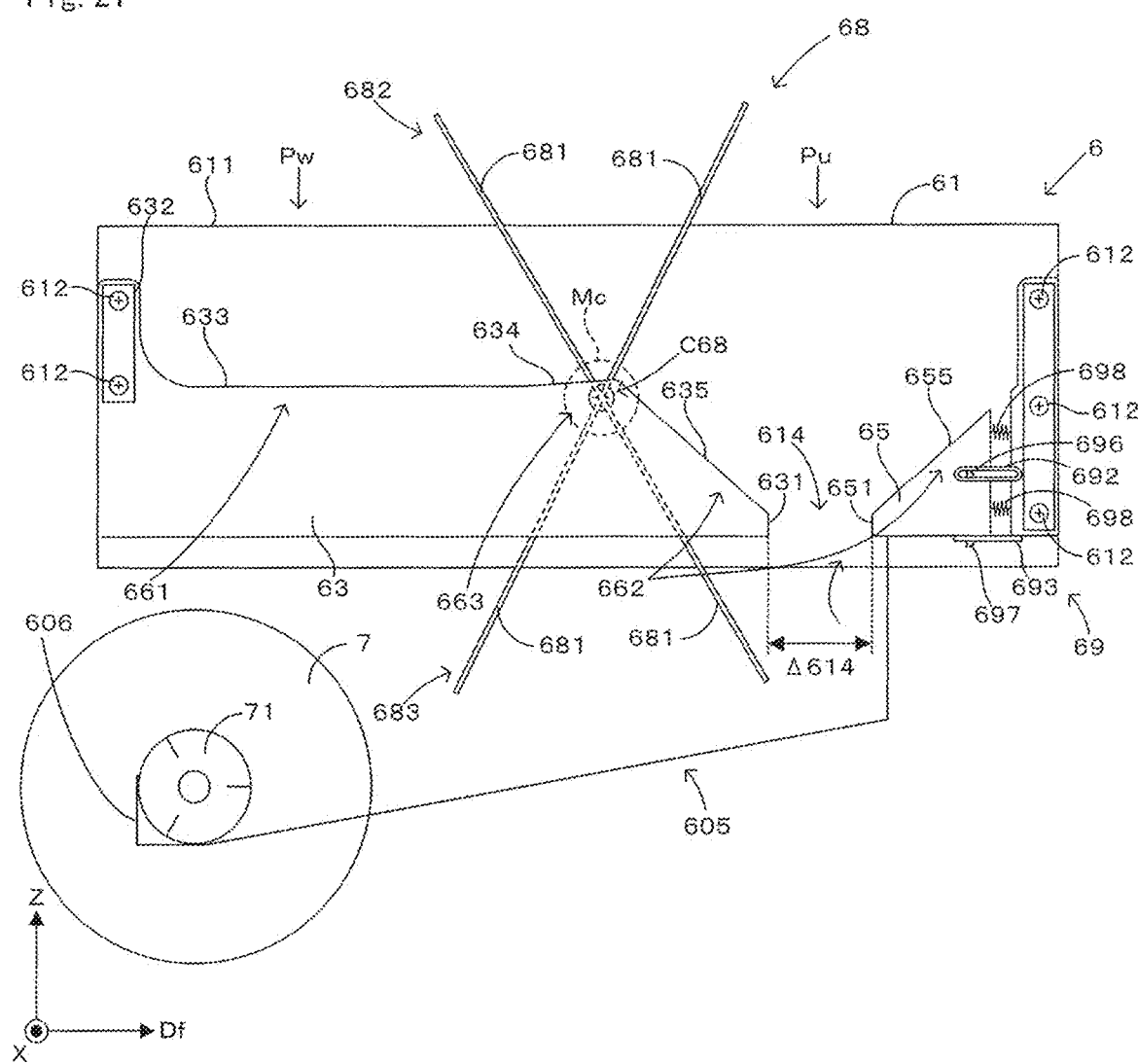
FIG. 21 is a side view schematically showing a fourth modification of the reel holder with the reel removed.

FIG. 21 is a side view schematically showing a fourth modification of the reel holder with the reel removed. Not the aforementioned screws 694, 695, but pins 696, 697 projecting from a reel supporting structure 65 are fitted into guide grooves of guide frames 692, 693 of a supporting mechanism 69 of this reel holder 6. Compressed springs 698 are provided between the reel supporting structure 65 supported by the guide frames 692, 693 and a base frame 691, and the reel supporting structure 65 is biased backward in the feed direction Df by the compressed springs 698.

In this reel holder 6, an axle ejecting part 68 held in contact with the axle 71 of the reel 7 having reached a discharge opening 614 from above pushes the axle 71 downwardly against biasing forces of the compressed springs 698 by receiving a drive force from a motor Mc and rotating. As a result, the axle 71 exits through the discharge opening 614 while pushing the reel supporting structure 65 forward in the feed direction Df and widening the discharge opening 614 in the feed direction Df. Note that the supporting mechanism 69 shown in the third and fourth modifications of FIGS. 20 and 21 is also applicable, for example, to the reel holder 6 according to the second modification.

Further, this reel holder 6 includes a reel receiving member 605 configured to receive the axle 71 of the reel 7 discharged through the discharge opening 614. The reel receiving member 605 extends obliquely downward toward the back from the front side of the discharge opening 614 in the feed direction Df, receives the axle 71 dropped from the discharge opening 614 and holds the axle 71 by a click standing on a rear end. In the case of using such a reel holder 6, the reel 7 discharged from the reel holder 6 is held in the reel receiving member 605, wherefore the reel collection container 49 may not be provided.

In the examples given above, two reels 7 are set at the reel holder 6 before the start of component mounting. However, two reels 7 are not always required to be set at the reel holder 6. The reel holder 6 can be configured as follows.

Figure 22:
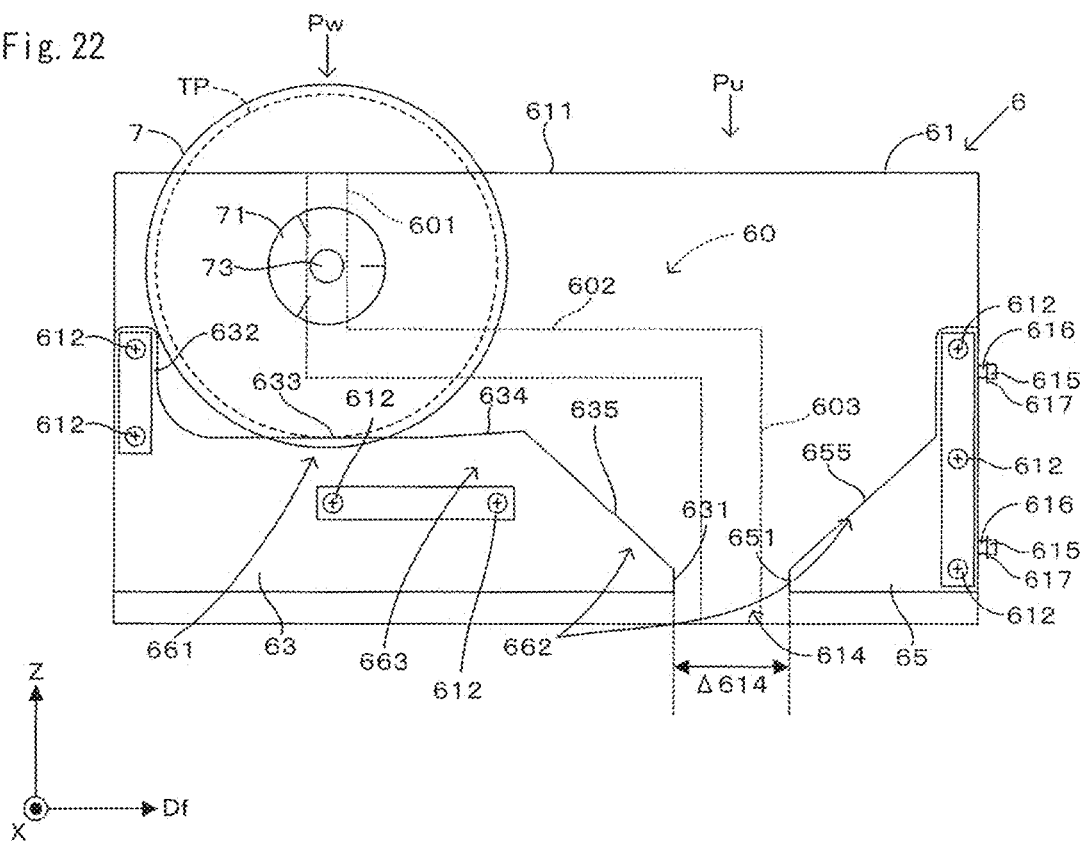
FIG. 22 is a side view schematically showing a fifth modification of a reel holder with a reel set.
Figure 23:
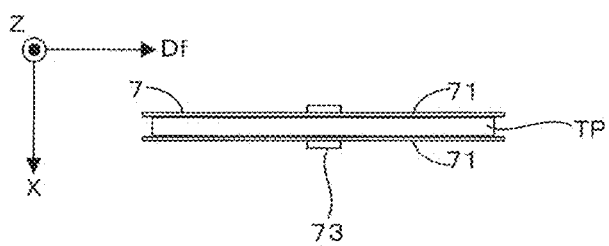
FIG. 23 is a plan view schematically showing the configuration of the reel 7 held by the reel holder according to the fifth modification.

FIG. 22 is a side view schematically showing a fifth modification of a reel holder with a reel set. FIG. 23 is a plan view schematically showing the configuration of the reel 7 held by the reel holder according to the fifth modification. The reel holder 6 of the fifth modification is configured to hold the reel 7 at the use position Pu and hold the reel 7 at a set position Ps behind the use position Pu in the feed direction Df in the same way as in the case described above. A new reel 7 on which the carrier tape TP is fully wound is set at the set position Ps by an operator. For some period of time after component mounting is started, the tape feeder 5 pulls out the carrier tape TP from the reel 7 set at the set position Ps. As the amount of the carrier tape TP is reduced, the reel 7 moves from the set position Ps to the use position Pu and is eventually discharged through the discharge opening 614.

Specifically, a guide groove 60 configured to guide the movement of the reel 7 is formed in each of the inner walls of the side covers 611 of the reel holder 6. The guide groove 60 has a configuration formed by connecting a lead-in part 601, a transition part 602, and a discharge part 603. The lead-in part 601 extends in the Z direction to be opened at the top while facing the axle 71 of the reel 7 set at the set position Ps from the X direction. The transition part 602 extends from the lower end of the lead-in part 601 horizontally and frontward in the feed direction Df to reach a position facing the axle 71 of the reel 7 at the use position Pu from the X direction. The discharge part 603 extends in the Z direction from the front end of the transition part 602 in the feed direction Df to the discharge opening 614 to be opened at the bottom while facing the axle 71 of the reel 7 at the use position Pu from the X direction.

The reel 7 includes a shaft 73 provided coaxially with the axle 71 and projecting from the axle 71. The shaft 73 is made of metal, for example, and has a diameter smaller than the width of the guide groove 60. The operator sets the reel 7 at the set position Ps by inserting the shaft 73 of the reel 7 from above into the lead-in part 601 of the guide groove 60.

Figure 24:
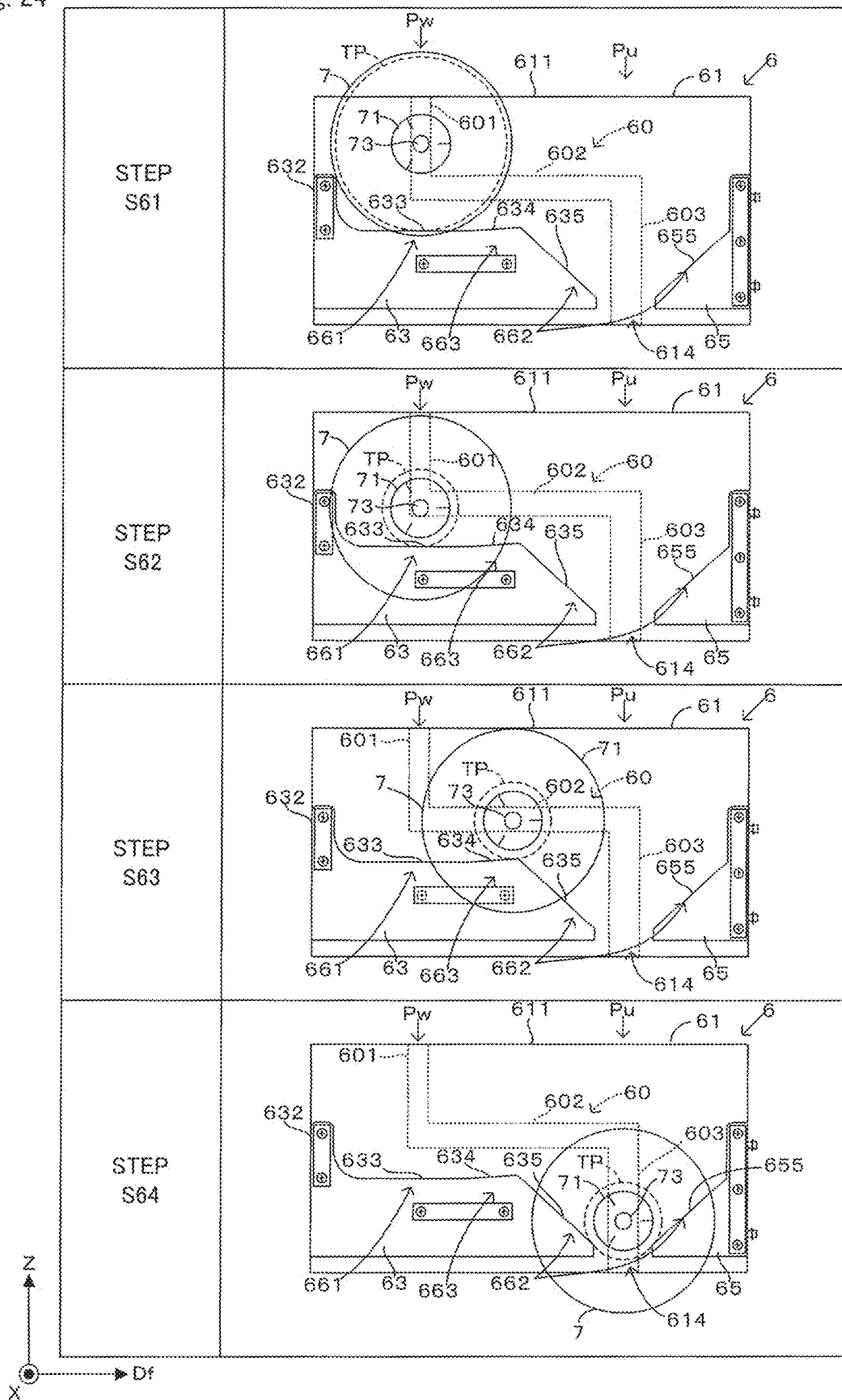
FIG. 24 includes side views schematically showing the operation of the reel holder according to the fifth embodiment.

FIG. 24 includes side views schematically showing the operation of the reel holder according to the fifth embodiment. FIG. 24 does not show the carrier tape TP pulled out from the reel 7 to be directed toward the tape feeder 5. In a state shown as step S61, the operator sets the reel 7 at the set position Ps before the component mounting is started. In this state, the carrier tape TP pulled out from the reel 7 at the set position Ps is inserted in the tape conveying path 53b of the tape feeder 5. In response to the start of the component mounting, the tape feeder 5 pulls out the carrier tape TP from the reel 7 at the set position Ps.

As shown in the field of step S62, as the amount of the carrier tape TP wound around the reel 7 reduces by executing the component mounting, the axle 71 of the reel 7 is gradually displaced downward along the lead-in part 601 of the guide groove 60 to make the shaft 73 attached to the axle 71 reach the lower end of the lead-in part 601, specifically, the back end of the transition part 602 in the feed direction Df.

Then, as shown in the field of step S63, the axle 71 moves forward in the feed direction Df in response to the force of pulling out the carrier tape TP applied from the tape feeder 5. At this time, the shaft 73 at the axle 71 is fitted in the transition part 602 of the guide groove 60, so that the axle 71 moves along the transition part 602.

Further, as shown in the field of step S64, when the shaft 73 at the axle 71 reaches the discharge part 603 of the guide groove 60, the axle 71 goes down along the discharge part 603 of the guide groove 60 to reach the use position Pu. Same as the embodiment described by referring to FIG. 6, the axle 71 of the reel 7 is supported at the use position Pu by abutting contact of the slope parts 635 and 655 with the carrier tape TP.

As described above, the reel holder 6 has the use position Pu facing the discharge opening 614 and the set position Ps provided on the opposite side of the tape feeder 5 across the use position Pu. The operator sets a new reel 7 at the set position Ps. As the amount of the carrier tape TP around the reel 7 at the set position Ps is reduced to make the shaft 73 at the axle 71 reach the transition part 602, the reel 7 pulled by the tape feeder 5 via the carrier tape TP starts to move from the set position Ps to the use position Pu. This movement of the reel 7 from the set position Ps to the use position Pu is guided by the side covers 611 along the transition part 602 of the guide groove 60. Then, the slope parts 635 and 655 abut on the carrier tape TP wound around the axle 71 of the reel 7 at the use position Pu.

In this configuration, if there exists no carrier tape TP wound around the reel 7, the axle 71 exits through the discharge opening 614 to discharge the reel 7 from the reel holder 6. The axle 71 is allowed to exit through the discharge opening 614 smoothly by the weight of the metallic shaft 73 attached to the axle 71. In this way, the reel holder 6 of the fifth modification also makes it possible to reduce operator's burden in removing the reel 7 after the carrier tape TP wound around the axle 71 is used up.

The side covers 611 guide the movement of the reel 7 from the set position Ps to the use position Pu along the transition part 602 of the guide groove 60 while restricting the reel 7 exiting upward. This makes it possible to guide the reel 7 reliably from the set position Ps to the use position Pu while restricting the reel 7 exiting upward.

In particular, the side covers 611 guide the reel 7 while catching the shaft 73 provided coaxially with the axle 71 of the reel 7 and projecting from the axle 71 in the guide groove 60. This makes it possible to guide the reel 7 reliably from the set position Ps to the use position Pu along the guide grooves 60.

Figure 25:
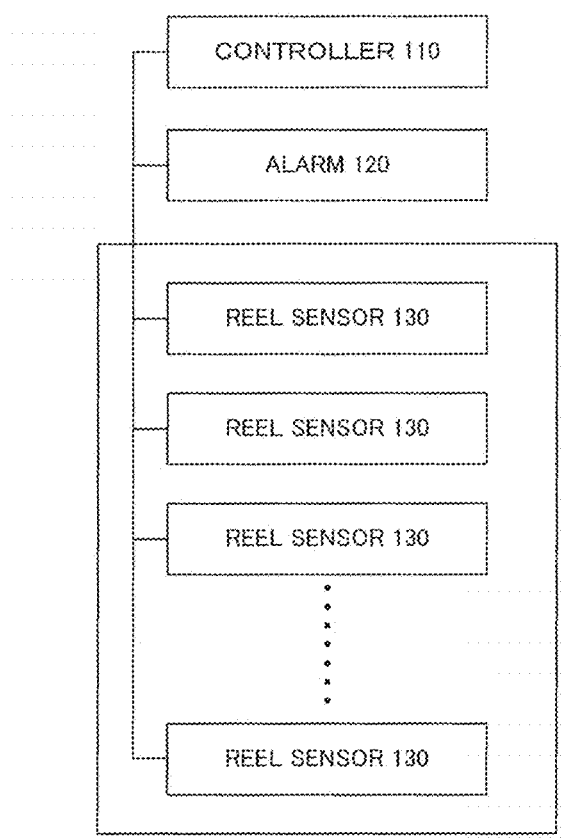
FIG. 25 is a block diagram showing an example of the electrical configuration of the component mounter.

FIG. 25 is a block diagram showing an example of the electrical configuration of the component mounter. This component mounter 1 includes a controller 110 configured by a CPU (Central Processing Unit) and a RAM (Random Access Memory) and an alarm 120 configured to notify a predetermined content to the operator. An alarm for notification to the operator, for example, by a buzzer sound or a warning light, an alarm for displaying a predetermined content to the operator such as a display or the like can be used as the alarm 120. Further, the component mounter 1 includes reel sensors 130 configured to detect the presence or absence of the reel 7 at the standby position Pw for each of the plurality of reel holders 6.

This controller 110 monitors an output of each reel sensor 130. If any one of the reel sensors 130 detects the absence of the reel 7 at the standby position Pw, the controller 110 causes the alarm 120 to issue a reel set request for requesting the operator to set a new reel 7 at the standby position Pw of the reel holder 6 for which the absence of the reel 7 has been detected. In this way, when the standby position Pw is emptied according to a movement from the standby position Pw to the use position Pu, the operator can quickly set the reel 7 at the standby position Pw in response to the reel set request.

Further, the controller 110 confirms by the reel sensor 130 whether or not the reel 7 has been set at the standby position Pw of the reel holder 6 for which the reel set request has been issued. In this way, it can be confirmed whether or not the reel 7 has been correctly set in the reel holding device for which the reel set request has been issued, out of the plurality of reel holders 6.

In this embodiment, the component mounter 1 corresponds to an example of the "component mounter" of the present disclosure. The reel 7 corresponds to an example of the "reel" of the present disclosure. The axle 71 corresponds to an example of the "axle" of the present disclosure. The discharge opening 614 corresponds to an example of the "discharge opening" of the present disclosure. The carrier tape TP corresponds to an example of the "carrier tape" of the present disclosure. The reel holder 6 corresponds to an example of the "reel holding device" of the present disclosure. The body 61 corresponds to an example of the "body" of the present disclosure. The reel supporting structures 63 and 65 correspond to an example of the "reel supporting member" of the present disclosure. The component supplying position 50 corresponds to an example of the "component supplying position" of the present disclosure. The feeder main body 51 corresponds to an example of the "tape supplying part" of the present disclosure. The slope parts 635 and 655 correspond to an example of the "abutting part" of the present disclosure. The axle ejecting part 68 corresponds to an example of the "axle ejecting part" of the present disclosure. The shutter member 67 corresponds to an example of the "shutter member" of the present disclosure. The reel collection container 49 corresponds to an example of the "collection container" of the present disclosure. The use position Pu corresponds to an example of the "first position" of the present disclosure. The set position Ps corresponds to an example of the "second position" of the present disclosure. The side cover 611 corresponds to an example of the "guide member" of the present disclosure. The guide groove 60 corresponds to an example of the "guide groove" of the present disclosure. The shaft 73 corresponds to an example of the "shaft" of the present disclosure.

The present disclosure is not limited to the above-described embodiment. Various changes are applicable to the above-described embodiment within a range not deviating from the substance of the disclosure. For example, in the above-described embodiment, the reel holder 6 has the configuration of discharging the reel 7 through the discharge opening 614 under the weight of the reel 7 or using the axle ejecting part 68. Alternatively, the reel 7 may be discharged with a hand of an operator. Even in this case, the operator is still allowed to discharge the reel 7 from the reel holder 6 by easy operation such as pushing out the axle 71 of the reel 7 through the discharge opening 614, for example. In this way, operator's burden in removing the reel 7 can be reduced after the carrier tape TP wound around the axle 71 is used up.

In the above-described embodiment, the reel 7 is set at the standby position Pw by an operator. Alternatively, a reel supplier configured to automatically set the reel 7 at the standby position Pw may be provided to the component mounter 1.

The specific configuration of the reel 7 is changeable in various ways. For example, the reel 7 with a hole formed in the side plate 72 is applicable for weight reduction.

The specific configuration of the tape feeder 5 is also changeable in various ways. For example, a component supplier described in Japanese Patent Application Laid-Open No. 2015-159142 is usable as the tape feeder 5.

The specific configuration of the reel holder 6 is also changeable in various ways. For example, the reel holder 6 of the above-described embodiment is capable of holding the reel 7 at the two positions, the use position Pu and the standby position Pw. Alternatively, the reel holder 6 may be configured to be capable of holding the reel 7 only at the single use position Pu.

The discharge opening 614 is provided at the bottom of the reel holder 6. However, this is not the only position of the discharge opening 614. For example, the discharge opening 614 may be provided at the front end of the reel holder 6 so as to have an opening pointing in the feed direction Df. In this case, while the reel supporting mechanism 65 is omitted, the slope part 635 of the reel supporting mechanism 63 may be extended to the discharge opening 614 at the front end of the body 61. This allows the axle 71 of the reel 7 to be guided to the discharge opening 614 along the slope part 635 sloping downward toward the discharge opening 614 in response to reduction in the amount of the carrier tape TP.

As described above by illustrating the specific embodiment of the present disclosure, the following exemplary configurations are applicable to the present disclosure.

The component mounter may be configured so that the reel holding device discharges the axle that has no carrier tape and reaches the discharge opening through the discharge opening. In this configuration, after the carrier tape around the reel is used up, the reel is discharged from the reel holder without requiring operation by an operator. This makes it possible to more effectively reduce operator's burden in removing the reel.

The component mounter may be configured so that the width of the discharge opening is equal to or more than the outer diameter of the axle, and the reel holding device discharges the axle that has no carrier tape and reaches the discharge opening through the discharge opening under the weight of the axle. By this simple configuration, the axle is allowed to be discharged through the discharge opening to discharge the reel from the reel holder.

The component mounter may be configured so that the abutting part includes a slope part configured to guide the axle to the discharge opening. This slope part is usable for guiding the axle precisely to the discharge opening.

The component mounter may be configured so that the reel holding device further includes an axle ejecting part configured to discharge the axle through the discharge opening by ejecting the axle that has no carrier tape and reaches the discharge opening. This configuration allows the axle to be discharge reliably through the discharge opening.

The component mounter may be further comprise a shutter member configured to generate a closed state and an open state selectively, the closed state being a state of restricting discharge of the axle through the discharge opening by closing the discharge opening, the open state being a state of allowing discharge of the axle through the discharge opening by opening the discharge opening. In this configuration, timing of discharging the reel from the reel holder can be adjusted by opening and closing the shutter member.

The component mounter may be further comprise a collection container configured to collect the reel discharged from the reel holding device as the axle is discharged through the discharge opening. This makes it possible to reduce the occurrence of littering with the reel discharged from the reel holder.

The component mounter may be configured so that the reel holding device further includes guide member configured to guide movement of the reel between a first position and a second position and supports the reel at each of the first position and the second position, the first position facing the discharge opening, the second position being provided for setting the reel by an operator and on the opposite side of the tape supplying part across the first position, the reel supported at the second position moves to the first position while being guided by the guide member when being pulled by the tape supplying part via the carrier tape, and the reel supporting member abuts on the carrier tape wound around the axle of the reel at the first position. In this configuration, the reel set at the second position by the operator moves to the first position as the carrier tape is pulled out by the tape supplying part. When the carrier tape is used up, the reel is discharged from the reel holder in response to discharge of the axle through the discharge opening. This makes it possible to reduce operator's burden in removing the reel after the carrier tape wound around the axle is used up.

The component mounter may be configured so that the guide member guide movement of the reel from the second position to the first position while restricting the reel exiting upward. This makes it possible to guide the reel from the second position to the first position reliably while restricting the reel exiting upward.

The component mounter may be configured so that the guide member has guide groove extending from the second position to the first position, and the guide member guide the reel while catching a shaft in the guide groove, the shaft being provided coaxially with the axle of the reel and projecting from the axle. This makes it possible to guide the reel from the second position to the first position reliably along the guide groove.

The component mounter may be configured so that the width of the discharge opening is adjustable. This makes it possible to properly hold and discharge various reels having axles of different outer diameters.

Specifically, the component mounter may be configured so that the reel supporting member support the axle by two reel supporting members arranged so as to sandwich the discharge opening, and the width of the discharge opening is adjusted by moving at least one of the two reel supporting members. Thus, the width of the discharge opening can be adjusted by easy operation of moving one of the two reel supporting members.

What is claimed is:

1. A component mounter comprising:
   a reel holder including a reel supporting member that supports an axle against a force of gravity and has an abutting part that supports a reel, form a discharge opening having a width that allows the axle of the reel to be discharged through the discharge opening, and abut on carrier tape that is wound around the axle and accommodates a component; and
   a tape supplier that pulls out the carrier tape from the reel held by the reel holder and feeds the carrier tape to a predetermined component supplying position, wherein
   the axle, which displaces under the force of gravity with decreasing amount of the carrier tape wound around the axle by pulling the carrier tape from the reel, is guided to the discharge opening by the reel supporting member, the width of the discharge opening is equal to or more than the outer diameter of the axle, and the reel holder discharges the axle that has no carrier tape and reaches the discharge opening through the discharge opening under a weight of the axle.

2. The component mounter according to claim 1, wherein:
the abutting part includes a slope part that guides the axle to the discharge opening.

3. The component mounter according to claim 2, further comprising:
a shutter that generates a closed state and an open state selectively, the closed state being a state of restricting discharge of the axle through the discharge opening by closing the discharge opening, and the open state being a state of allowing discharge of the axle through the discharge opening by opening the discharge opening.

4. The component mounter according to claim 1, further comprising:
a shutter that generates a closed state and an open state selectively, the closed state being a state of restricting discharge of the axle through the discharge opening by closing the discharge opening, and the open state being a state of allowing discharge of the axle through the discharge opening by opening the discharge opening.

5. The component mounter according to claim 1, further comprising a collection container that collects the reel discharged from the reel holder as the axle is discharged through the discharge opening.

6. The component mounter according to claim 1, wherein:
the abutting part includes a slope part that guides the axle to the discharge opening.

7. The component mounter according to claim 1, further comprising:
a shutter that generates a closed state and an open state selectively, the closed state being a state of restricting discharge of the axle through the discharge opening by closing the discharge opening, and the open state being a state of allowing discharge of the axle through the discharge opening by opening the discharge opening.

8. A component mounter comprising:
a reel holder including a reel supporting member that supports an axle against a force of gravity and has an abutting part that supports a reel, form a discharge opening having a width that allows the axle of the reel to be discharged through the discharge opening, and abut on carrier tape that is wound around the axle and accommodates a component; and
a tape supplier that pulls out the carrier tape from the reel held by the reel holder and feeds the carrier tape to a predetermined component supplying position, wherein
the axle, which displaces under the force of gravity with decreasing amount of the carrier tape wound around the axle by pulling the carrier tape from the reel, is guided to the discharge opening by the reel supporting member,
the reel holder further includes guide member that guides movement of the reel between a first position and a second position and supports the reel at each of the first position and the second position, the first position facing the discharge opening, the second position being provided for setting the reel by an operator and on the opposite side of the tape supplier across the first position,
the reel supported at the second position moves to the first position while being guided by the guide member when being pulled by the tape supplier via the carrier tape, and the reel supporting member abuts on the carrier tape wound around the axle of the reel at the first position.

9. The component mounter according to claim 8, wherein:
the guide member guides movement of the reel from the second position to the first position while restricting the reel exiting upward.

10. The component mounter according to claim 8, wherein:
the guide member has guide groove extending from the second position to the first position, and the guide member guides the reel while catching a shaft in the guide groove, the shaft being provided coaxially with the axle of the reel and projecting from the axle.

11. A component mounter comprising:
a reel holder including a reel supporting member that supports an axle against a force of gravity and has an abutting part that supports a reel, form a discharge opening having a width that allows the axle of the reel to be discharged through the discharge opening, and abut on carrier tape that is wound around the axle and accommodates a component; and
a tape supplier that pulls out the carrier tape from the reel held by the reel holder and feeds the carrier tape to a predetermined component supplying position, wherein
the axle, which displaces under the force of gravity with decreasing amount of the carrier tape wound around the axle by pulling the carrier tape from the reel, is guided to the discharge opening by the reel supporting member, and
the width of the discharge opening is adjustable.

12. The component mounter according to claim 11, wherein
the reel supporting member comprises two reel supporting portions arranged to support the axle and sandwich the discharge opening, and the width of the discharge opening is adjusted by moving at least one of the two reel supporting portions.

13. A reel holder comprising:
a body that houses a reel having an axle around which a carrier tape housing a component is wound; and
a reel supporting member that is attached to the body and that forms a discharge opening, having a width allowing the axle to be discharged through the discharge opening, and supports the axle against the force of gravity by abutting on the carrier tape, wherein
the axle, which displaces under the force of gravity with decreasing amount of the carrier tape wound around the axle by pulling the carrier tape from the reel, is guided to the discharge opening by the reel supporting member,
the width of the discharge opening is equal to or more than the outer diameter of the axle, and
the reel holder discharges the axle that has no carrier tape and reaches the discharge opening through the discharge opening under a weight of the axle.

14. A reel holder comprising:
a body that houses a reel having an axle around which a carrier tape housing a component is wound; and
a reel supporting member that is attached to the body and that forms a discharge opening, having a width allowing the axle to be discharged through the discharge opening, and supports the axle against the force of gravity by abutting on the carrier tape, wherein
the axle, which displaces under the force of gravity with decreasing amount of the carrier tape wound around the axle by pulling the carrier tape from the reel, is guided to the discharge opening by the reel supporting member, the reel holder further includes guide member that guides movement of the reel between a first position and a second position and supports the reel at each of the first position and the second position, the first position facing the discharge opening, the second position being provided for setting the reel by an operator and on the opposite side of the tape supplier across the first position, the reel supported at the second position moves to the first position while being guided by the guide member when being pulled by the tape supplier via the carrier tape, and the reel supporting member abuts on the carrier tape wound around the axle of the reel at the first position.

15. A reel holder comprising:

a body that houses a reel having an axle around which a carrier tape housing a component is wound; and a reel supporting member that is attached to the body and that forms a discharge opening, having a width allowing the axle to be discharged through the discharge opening, and supports the axle against the force of gravity by abutting on the carrier tape, wherein the axle, which displaces under the force of gravity with decreasing amount of the carrier tape wound around the axle by pulling the carrier tape from the reel, is guided to the discharge opening by the reel supporting member, and the width of the discharge opening is adjustable.

* * * * *